US012745432B2

(12) United States Patent
Hell et al.

(10) Patent No.: US 12,745,432 B2
(45) Date of Patent: Sep. 22, 2026

(54) METHOD FOR FORMING A DRIFT REGION OF A SUPERJUNCTION DEVICE

(71) Applicant: Infineon Technologies AG, Neubiberg (DE)

(72) Inventors: Michael Hell, Erlangen (DE); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 1082 days.

(21) Appl. No.: 17/846,638

(22) Filed: Jun. 22, 2022

(65) Prior Publication Data

US 2023/0006038 A1 Jan. 5, 2023

(30) Foreign Application Priority Data

Jul. 1, 2021 (DE) ......................... 102021116945.3

(51) Int. Cl.
*H10D 62/10* (2025.01)
*H10D 8/01* (2025.01)
(Continued)

(52) U.S. Cl.
CPC ........... *H10D 62/111* (2025.01); *H10D 8/051* (2025.01); *H10D 8/60* (2025.01); *H10D 30/60* (2025.01);
(Continued)

(58) Field of Classification Search
CPC ........ H10D 62/111; H10D 8/051; H10D 8/60; H10D 30/60; H10D 30/66; H10D 30/668;
(Continued)

(56) References Cited

U.S. PATENT DOCUMENTS

2003/0132450 A1* 7/2003 Minato ................ H10D 30/655 257/E21.345
2014/0167205 A1* 6/2014 Chang .................... H10D 8/051 257/494
2019/0058038 A1* 2/2019 Weber .............. H01L 21/26586

FOREIGN PATENT DOCUMENTS

CN 112151618 A 12/2020

OTHER PUBLICATIONS

Phelps, G.J., et al., "Enhanced nitrogen diffusion in 4H—SiC", Applied Physics Letters, vol. 80, No. 2, https://doi.org/10.1063/1.1432451, Jan. 14, 2002, pp. 1-4.

* cited by examiner

*Primary Examiner* — Britt Hanley
*Assistant Examiner* — Victor V Barzykin
(74) *Attorney, Agent, or Firm* — Murphy, Bilak & Homiller, PLLC

(57) ABSTRACT

A method for forming a drift region of a superjunction device includes forming a drift region section having a semiconductor layer with first regions of a first doping type and second regions of a second doping type arranged alternatingly in a first lateral direction. Forming the drift region section includes: forming an implantation mask on top of a first surface of the semiconductor layer and including first openings; in a first implantation process, implanting dopant atoms of the first doping type through the first openings into the first surface; increasing a size of the first openings to obtain second openings; in a second implantation process, implanting dopant atoms of the second doping type through the second openings into the first surface; and after removing the mask, in a third implantation process, implanting dopant atoms of the first doping type into the first surface.

14 Claims, 13 Drawing Sheets

(51) Int. Cl.

| | |
|---|---|
| ***H10D 8/60*** | (2025.01) |
| ***H10D 30/60*** | (2025.01) |
| ***H10D 30/66*** | (2025.01) |
| ***H10P 30/20*** | (2026.01) |
| ***H10P 30/22*** | (2026.01) |
| *H10D 62/832* | (2025.01) |

(52) U.S. Cl.
CPC ........... *H10D 30/66* (2025.01); *H10D 30/668* (2025.01); *H10D 62/124* (2025.01); *H10P 30/204* (2026.01); *H10P 30/21* (2026.01); *H10P 30/22* (2026.01); *H10D 62/8325* (2025.01)

(58) Field of Classification Search
CPC .............. H10D 62/124; H10D 62/8325; H01L 21/26513; H01L 21/266
See application file for complete search history.

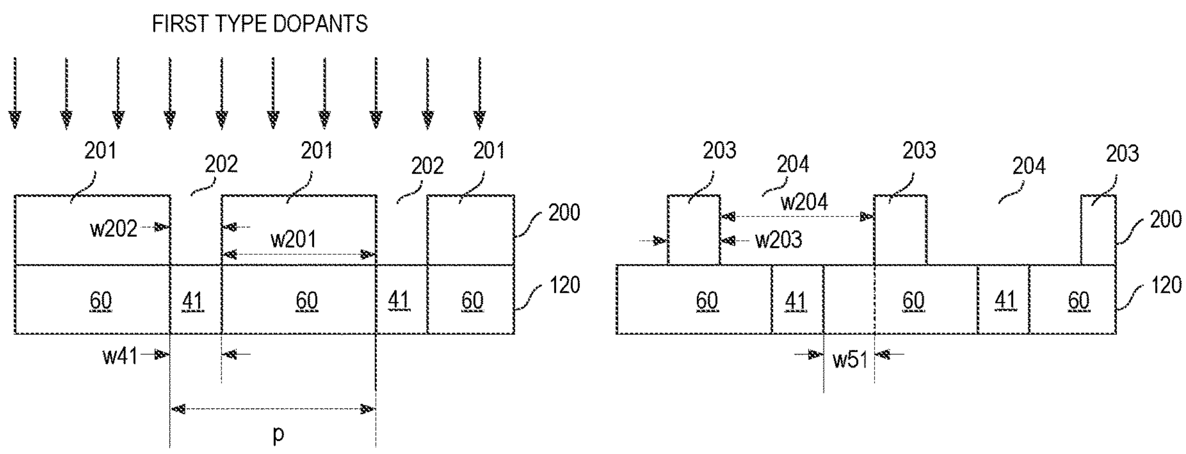
FIG 4A
FIG 4B
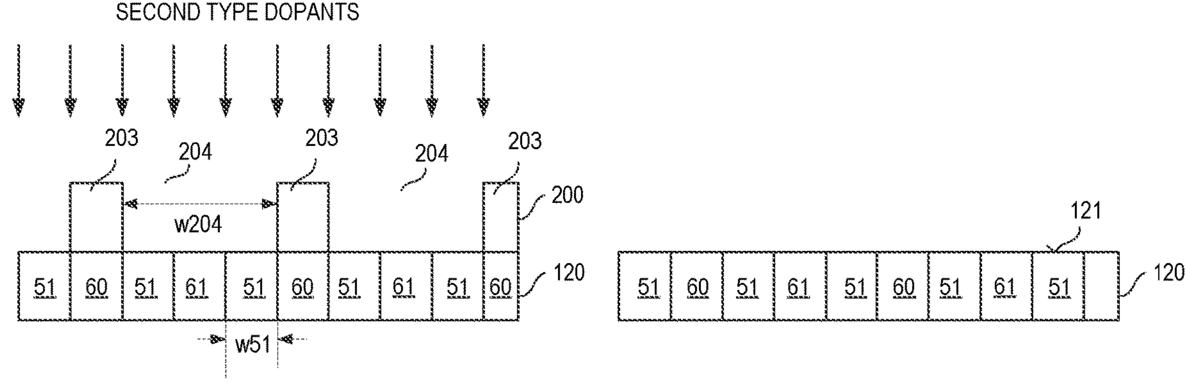
FIG 4C
FIG 4D
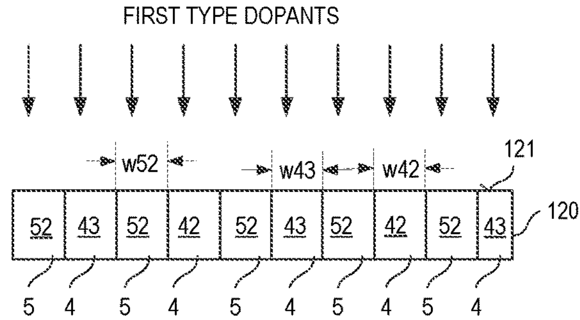
FIG 4E

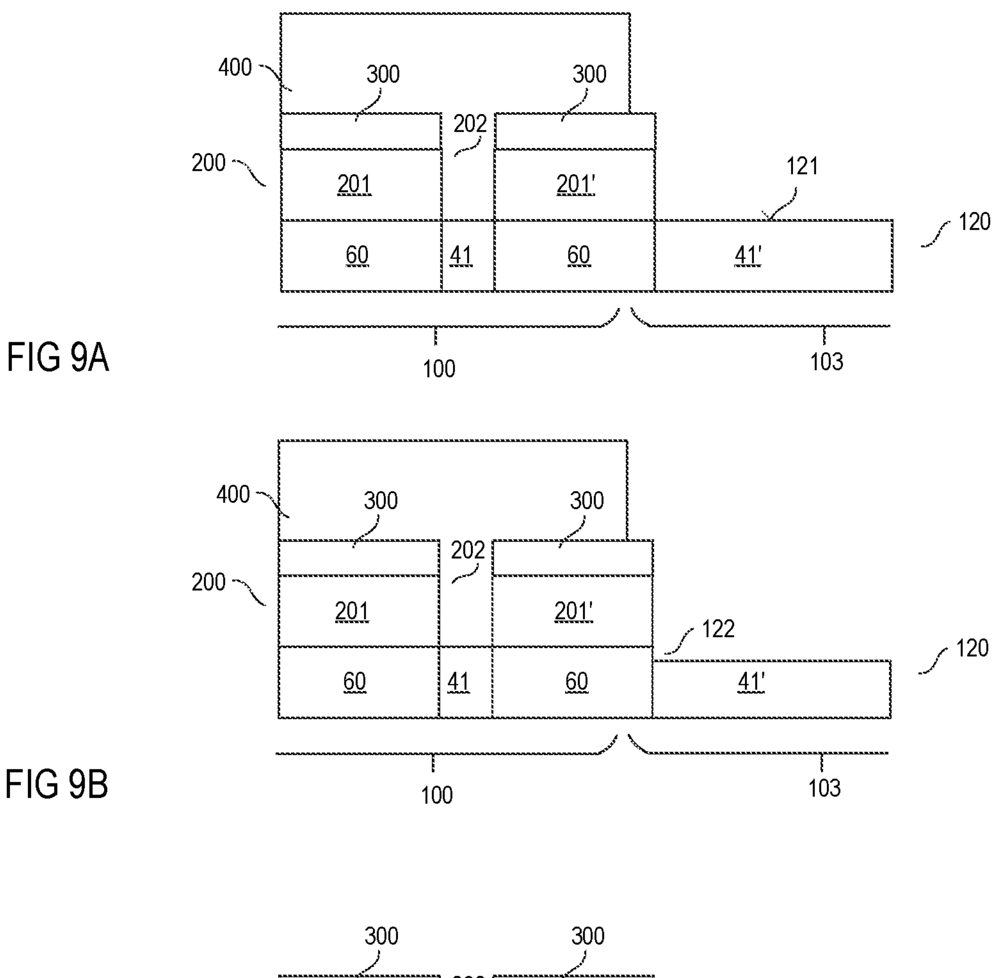
FIG 9A
FIG 9B
FIG 9C
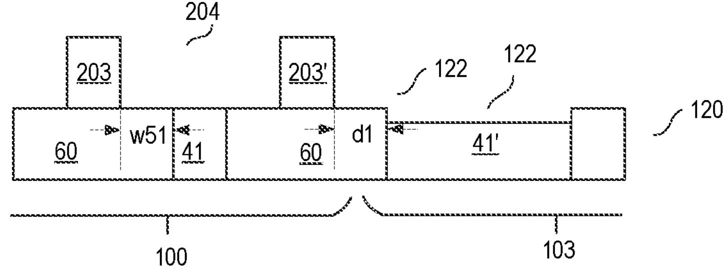
FIG 9D

METHOD FOR FORMING A DRIFT REGION OF A SUPERJUNCTION DEVICE

TECHNICAL FIELD

This disclosure relates in general to methods of forming a drift region of a superjunction device such as a superjunction transistor device.

BACKGROUND

A superjunction device includes a drift region with a plurality of first regions of a first doping type (conductivity type) and a plurality of second regions of a second doping type complementary to the first doping type, wherein the first and second regions are arranged alternatingly. In some publications, the first doping type regions are referred to as drift regions and the second doping type regions are referred to as compensation regions.

Forming the drift region may include forming at least one semiconductor layer, implanting the first type dopant atoms into the semiconductor layer through openings in a first implantation mask, and implanting the second type dopant atoms into the semiconductor layer through openings in a second implantation mask different from the first implantation mask. It is desirable to balance the amount of first type dopant atoms implanted in the first implantation process and the amount of second type dopant atoms implanted in the second implantation process. This may be achieved by forming the openings in the first and second implantation mask such that these openings have the same size, so that the same amount of dopant atoms is implanted into each opening. Due to variations in the manufacturing process of the first and second implantation masks, however, the size of the openings may vary up to 20% relative to a desired size, which may result in a significant imbalance of the amount of first type and second type dopant atoms.

There is a need for an improved process for forming a drift region of a superjunction device.

SUMMARY

One example relates to a method. The method includes forming at least one drift region section that includes a semiconductor layer with first regions of a first doping type and second regions of a second doping type, wherein the first regions and the second regions are arranged alternatingly in a first lateral direction of the semiconductor layer. Forming the at least one drift region section includes: forming an implantation mask on top of a first surface of the semiconductor layer, wherein the implantation mask includes first openings each having a first width in the first lateral direction; in a first implantation process, implanting dopant atoms of the first doping type through the first openings into the first surface; increasing a size of the first openings to obtain second openings having a second width in the lateral direction; in a second implantation process, implanting dopant atoms of the second doping type through the second openings into the first surface; removing the implantation mask; and after removing the implantation mask, in a third implantation process, implanting dopant atoms of the first doping type into the first surface.

Another example to relates to another the method. The method includes: forming at least one drift region section that includes a semiconductor layer with first regions of a first doping type and second regions of a second doping type, wherein the first regions and the second regions are arranged alternatingly in a first lateral direction of the semiconductor layer. Forming the at least one drift region section includes: forming an implantation mask on top of a first surface of the semiconductor layer, wherein the implantation mask includes first openings each having a first width in the first lateral direction; in a first implantation process, implanting dopant atoms of the second doping type through the first openings into the first surface; reducing a size of the first openings to obtain second openings having a second width in the lateral direction; in a second implantation process, implanting dopant atoms of the first doping type through the second openings into the first surface; removing the implantation mask; and after removing the implantation mask, in a third implantation process, implanting dopant atoms of the first doping type into the first surface.

Yet another example relates to a superjunction device. The superjunction device includes at least one drift region section that includes a semiconductor layer with first regions of a first doping type and second regions of a second doping type. The first regions and the second regions are arranged alternatingly in a first lateral direction of the semiconductor layer, wherein first regions of a first group include an implantation dose of the first doping type, only, and wherein a second group of the first regions include an implantation dose of the first doping type and an implantation dose of the second doping type.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIGS. 4A-4E show a vertical cross sectional view of a semiconductor layer during process sequences according to FIG. 3;

FIGS. 9A-9D illustrates one example of a method for monitoring a lateral etching process;

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
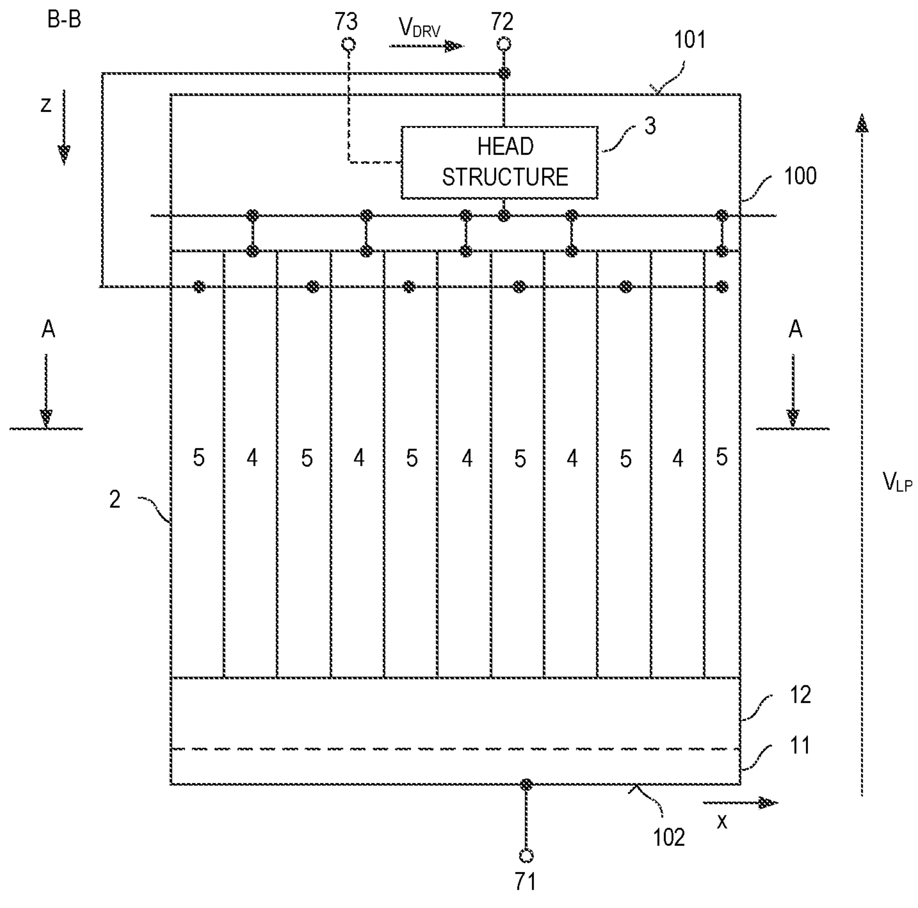
FIG. 1 shows a vertical cross sectional view of a superjunction device according to one example.

FIG. 1 schematically illustrates a sectional view of one section of a superjunction device. The superjunction device includes a semiconductor body 100 and a drift region 2 arranged in the semiconductor body 100. The drift region 2 includes a plurality of first regions 4 of a first doping type (conductivity type) and a plurality of second regions 5 of a second doping type (conductivity type) complementary to the first doping type. The first regions 4 and the second regions 5 are arranged alternately in the semiconductor body 100, and a pn-junction is formed between each first region 4 and a corresponding adjoining second region 5. Just for the purpose of illustration, in the example shown in FIG. 1, the first regions 4 and the second regions 5 are arranged alternately in a first lateral direction x of the semiconductor body 100.

The semiconductor body 100 may include a conventional semiconductor material. According to one example, the semiconductor body 100 is based on silicon carbide (SiC). According to another example, the semiconductor body 100 is based on silicon (Si). In this context, "based on a material" may mean that the semiconductor body 100 comprises or essentially consists of said semiconductor material, except for unwanted impurities or intentional doping.

Figure 2:
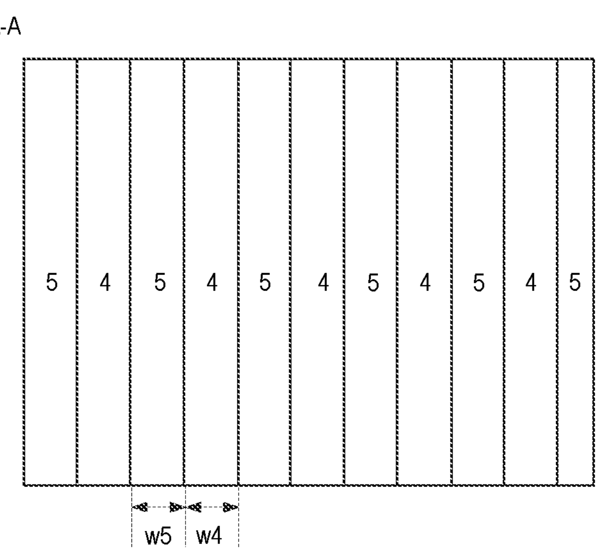
FIG. 2 shows a horizontal cross sectional view of one example of a drift region of the superjunction device.

The first and second regions 4, 5 may be elongated in a second lateral direction y of the semiconductor body 100. This is illustrated in FIG. 2 that shows a horizontal cross sectional view of the semiconductor body 100 according to FIG. 1 in a horizontal section plane A-A. The "horizontal section plane A-A" is a section plane that is perpendicular to the vertical section plane shown in FIG. 1. The second lateral direction y is essentially perpendicular to the first lateral direction x, according to one example. The first and second regions 4, 5 being "elongated" means that a length of the first and second regions 4, 5, which is a dimension in the second lateral direction y, is significantly greater than a respective width, which is a dimension in the first lateral direction. In the examples shown in FIGS. 1 and 2, the width w4, w5 is the dimension in the first lateral direction x and the "length" is the dimension in the second lateral direction y of the semiconductor body 100. According to one example, "significantly greater" means that a ratio between the length and the width is greater than 10, greater than 100, or even greater than 1000.

Referring to FIG. 1, the first regions 4 are connected to a first load node 71 of the superjunction device, and the second regions 5 are connected to a second load node 72 of the transistor device. A connection between the second regions 5 and the second load node 72 is only schematically illustrated in FIG. 1. Examples of how these connections can be implemented are explained with reference to examples herein further below.

According to one example, the first regions 4 are connected to the first load node 71 via a further semiconductor region 11 of the first doping type.

The further semiconductor region 11 may adjoin the first regions 4. This, however, is not shown in FIG. 1. Optionally, as shown in FIG. 1, a buffer region 12 of the first doping type is arranged between the further semiconductor region 11 and the first regions 4. According to one example, a doping concentration of the buffer region 12 is lower than a doping concentration of the further semiconductor region 11. According to one example, the doping concentration of the buffer region 12 is lower than the doping concentration of the further semiconductor region 11 and may be less than 20%, less than 10% or even less than 1% of the doping concentration of the further semiconductor region 11.

Referring to FIG. 1, the superjunction device further includes a head structure 3 connected between the second load node 72 and the first regions 4. The head structure 3 may at least partially be integrated in the semiconductor body 100. Examples of how the head structure 3 may be implemented are explained with reference to examples herein further below.

Basically, the head structure 3, defines an operating state of the superjunction device, wherein the operating state may include a conducting state or a blocking state. In the conducting state, the superjunction device is configured to conduct a current via the first regions 4 between the first load node 71 and the second load node 72 when a voltage is applied between the first load node 71 and the second load node 72. In the blocking state, the superjunction device is configured to block when a voltage is applied between the first load node 71 and the second load node 72, provided that the voltage is lower than a voltage blocking capability of the superjunction device. The "voltage blocking capability" is the maximum voltage the superjunction device can withstand in the blocking state before an Avalanche breakdown occurs.

The implementation of the head structure 3 is dependent on the type of the superjunction device. The superjunction device may be implemented as a passive device, such as a Schottky diode. In this case, the operating state of the superjunction device is only dependent on a polarity of a load path voltage $V_{LP}$ applied between the first load node 71 and the second load node 72, wherein the superjunction device is in the conducting state when the load path voltage $V_{PL}$ has a first polarity and the blocking state when the load path voltage $V_{PL}$ has a second polarity opposite the first polarity.

The superjunction device may also be implemented as an active device, such as a transistor device. In this case, the control structure may include a control node 73 (illustrated in dashed lines in FIG. 1) that is configured to control a conducting channel between the second load node 72 and the first regions 4 dependent on a drive voltage $V_{DRV}$ applied between the control node 73 and the second load node 72. In a transistor device, the first load node 71 may be referred to as drain node, the second load node 72 may be referred to as source node, the control node 73 may be referred to as gate node, the load path voltage $V_{LP}$ may be referred to as drain-source voltage, and the drive voltage $V_{DRV}$ may be referred to as gate-source voltage. The further semiconductor region 11 may form a drain region of the transistor device.

A transistor device can be operated in a forward biased state and a reverse biased state. Whether the device is in the forward biased state or the reverse biased state is dependent on a polarity of the load path voltage (drain-source voltage) $V_{LP}$. In the reverse biased state the polarity and a magnitude of the drain-source voltage $V_{LP}$ is such that the pn-junction between the first and second regions 4, 5 are forward biased independent of the drive voltage (gate-source voltage) $V_{DRV}$. Thus, in the reverse biased state, the transistor device conducts a current independent of an operating state of the head structure 3.

In the forward biased state of the transistor device, the polarity of the drain-source voltage $V_{DS}$ is such that the operating state can be controlled by the gate-source voltage $V_{DRV}$. In the forward biased state, the transistor device can be operated in the conducting state (on-state) or the blocking state (off-state). In the on-state, the head structure 3 generates a conducting channel between the second load node 72 and the first regions 4 so that a current can flow between the first load node 71 and the second load node 72 via the head structure 3 and the first regions 4 of the first doping type. In the off-state the conducting channel in the head structure 3 is interrupted.

The superjunction device has a current flow direction, which is a direction in which a current may flow between the first load node 71 and the second load node 72 inside the semiconductor body 100 in the first regions 4. In the example shown in FIG. 1, the current flow direction corresponds to the vertical direction z of the semiconductor body 100, so that the further semiconductor region 11 is spaced apart from the head structure 3 in the vertical direction. The vertical direction z may run perpendicular to the first lateral direction x and the second lateral direction y, along which the semiconductor body 100 mainly expands. A first surface 101 of the semiconductor body is a surface below which active regions of the head structure 3 are integrated in the semiconductor body 100, and a second surface 102 of the semiconductor body 100 is formed by the further semiconductor region 11. The "vertical cross sectional view" illustrated in FIG. 1 is a sectional view in a section plane perpendicular to the first surface 101 and the second surface 102 and parallel to the vertical direction z.

In the blocking state of the superjunction device, space charge regions (depletion regions) expand in the first regions 4 and the second regions 5, so that the first regions 4 and the second regions 5 may become depleted of charge carriers as the load path voltage increases. In this way, charge carriers in the first regions 4 are "compensated" by charge carriers in the second regions 5. Thus, as compared to a conventional device that is devoid of the second regions, the first regions 4 can be implemented with a higher doping concentration, wherein the higher doping concentration of the first regions 4 results in a reduced on-resistance as compared to the conventional device. The "on-resistance" is the electrical resistance of the device between the first load node 71 and the second load node 72 in the conducting state.

In the manufacturing process of a superjunction device of the type shown in FIG. 1, it is desirable to precisely control the amount of charge carriers of the first doping type and the amount of charge carriers of the second doping type that are introduced into the semiconductor body 100.

Figure 3:
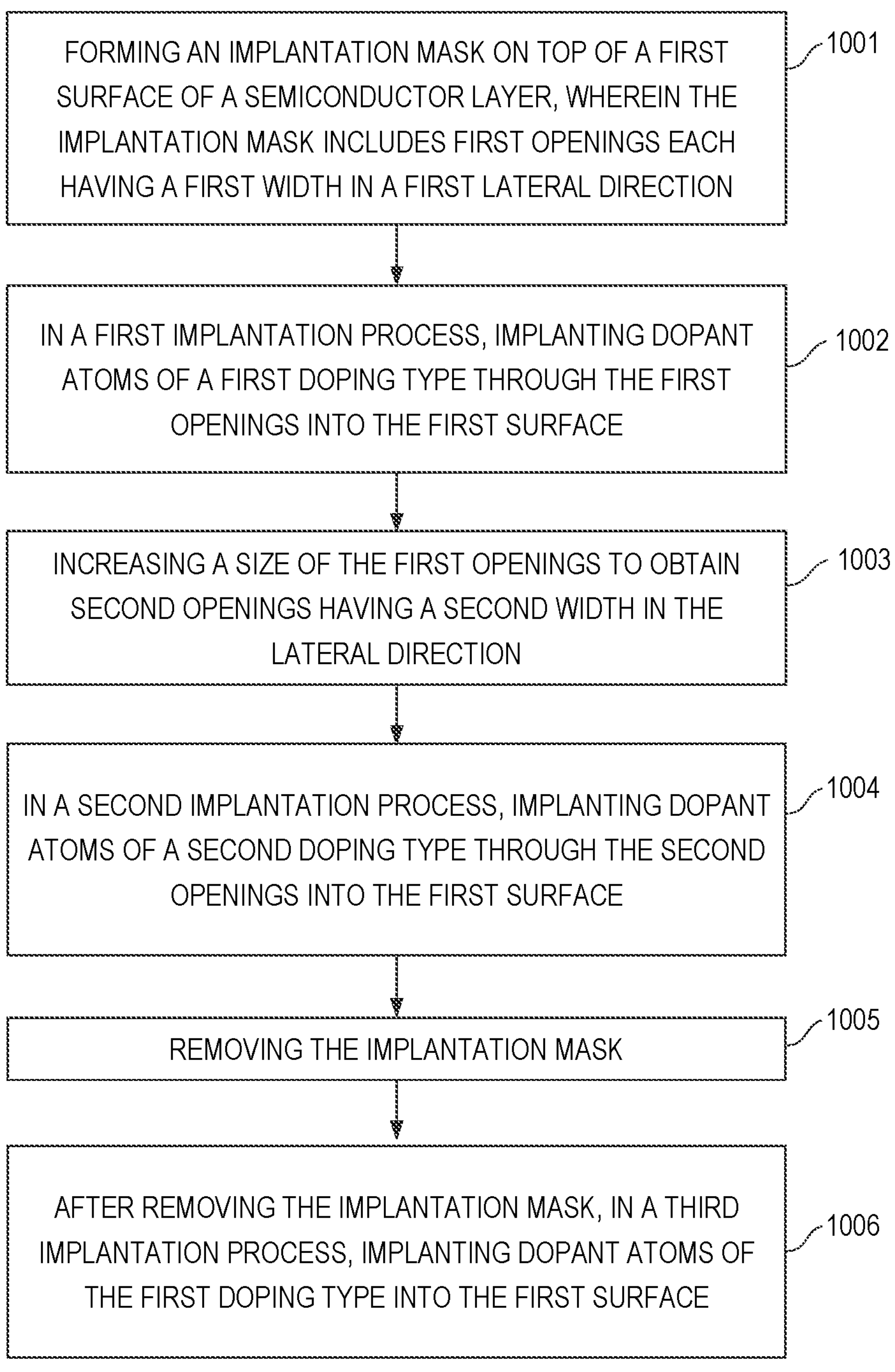
FIG. 3 shows a flowchart of one example of a method for forming one or more drift region sections of the drift region.

FIG. 3 illustrates a flow chart of one example of a method for forming a drift region section that includes a semiconductor layer with first regions of a first doping type and second regions of a second doping type, wherein the first regions and the second regions are arranged alternatingly in a first lateral direction of the semiconductor layer. According to one example, the drift region section formed in accordance with the flow chart according to FIG. 3 forms the drift region of the superjunction device. According to another example, forming the drift region includes forming two or more drift region sections one above the other.

Referring to FIG. 3, the method includes forming an implantation mask top of a first surface of the semiconductor layer, wherein the implantation mask includes first openings that each have a first width in a first lateral direction (1001). The method further includes, in a first implantation process, implanting dopant atoms of a first doping type through the first openings into the first surface (1002), and, after the first implantation process, increasing a size of the first openings to obtain second openings that have a second width in the lateral direction (1003). The method further includes, in a second implantation process, implanting dopant atoms of the second doping type through the second openings into the first surface (1004), removing the implantation mask (1005), and, after removing the implantation mask, in a third implantation process, implanting dopant atoms of the first doping type into the first surface (1006).

One example of the method according to FIG. 3 is illustrated in FIGS. 4A-4E in greater detail. Each of these figures shows a vertical cross sectional view of one section of a semiconductor layer 120 during the manufacturing process. This semiconductor layer 120 forms a portion of the semiconductor body 100 of the finished transistor device. At the time of processing the first semiconductor layer 120, further sections of the semiconductor body 100, such as the further semiconductor region 11 and the optional buffer region 12, may already have been formed. These further sections, however, are not illustrated in FIGS. 4A-4E.

Referring to FIG. 4A, the method includes forming an implantation mask 200 on top of a first surface 121 of the semiconductor layer 120. The implantation mask 200 includes first openings 202 and first mask regions (mesa regions) 201 that are arranged between the first openings 202. According to one example, the implantation mask 200 is or comprises an oxide hard mask. Forming the first openings may include forming an etch mask (not shown) on top of the layer forming the implantation mask, and etching the openings in an anisotropic etching process.

Referring to FIG. 4A, the method further includes implanting first type dopant atoms via the first openings 202 of the implantation mask 200 into the semiconductor layer 120. Implanting the first type dopant atoms in the first implantation process results in first implanted regions 41 in the semiconductor layer 120, wherein the first implanted regions 41 include dopant atoms of the first doping type.

After the first implantation process illustrated in FIG. 4A, the semiconductor layer 120 includes the first implanted regions 41 below the openings 202 and regions 60 that are located below those sections of the first surface 121 that are covered by the mask regions 201 of the implantation mask 200. These regions 60 are not affected by the implantation process, so that a doping concentration of these regions 60 after the first implantation process equals a basic doping concentration of the semiconductor layer 120 before forming the implantation mask 200. These regions are therefore referred to as basic regions 60 in the following According to one example, the semiconductor layer 120 is intrinsic or lightly doped, so that its basic doping concentration is lower than 1E17 $cm^{-3}$, lower than 1E15 $cm^{3}$, or even lower than 1E14 $cm^{3}$.

Each of the first openings 202 has a certain width w202 in a lateral direction. This width w202 is referred to as first opening width or, briefly, first width in the following.

According to one example, the lateral direction is the first lateral direction x which, referring to FIG. 1, is the direction in which the first and second regions 4, 5 are alternatingly arranged in the finished transistor device. Furthermore, each of the first mask regions has a certain width w201 in the first lateral direction x. This width w201 is referred to as first mask region width in the following.

Referring to FIG. 4B, the method further includes increasing a size of the first openings 202, so that second openings 204 and second mask regions 203 are formed. The second openings 204 have a second width w204 greater than the first width w202 (w204>w202) in the first lateral direction x. The second mask regions 203 result from the first mask regions 201 by increasing the size of the first openings 202, that is, by removing material from the first mask regions 201. Thus, the second mask regions 203 have a second mask region width w203 that is lower than the first mask region width w201 (w203<w201).

Referring to FIG. 4C, the method further includes implanting dopant atoms of the second doping type through the second openings 204 into the first surface 121 to form second implanted regions 61 and third implanted regions 51. The second implanted regions 61 are those regions that result from the first implanted regions 41 by additionally implanting the dopant atoms of the second doping type. The third implanted regions 51 are those regions that result from implanting the dopant atoms of the second doping type into those sections of the basic regions 60 that are uncovered in the process of increasing the size of the first openings 202 and reducing the size of the first mask regions 201.

Referring to FIGS. 4D-4E, the method further includes removing the implantation mask 200 and blanket implanting dopant atoms of the first doping type into the first surface 101 of the semiconductor layer 120 in a third implantation process. In this third implantation process fourth implanted regions 42, fifth implanted regions 52 and sixth implanted regions 43 are formed. The fourth implanted regions 42 result from implanting the first type dopant atoms into the second implanted regions 61, and the fifth implanted regions 52 result from implanting the first type dopant atoms into the third implanted regions 51. Furthermore, the sixth implanted regions 43 result from implanting the first type dopant atoms into those section of the semiconductor layer 120 that are uncovered by removing the implantation mask 200 and that have the basic doping of the semiconductor layer 120.

Each of the first, second, and third implantation processes is associated with a certain implantation dose. The "implantation dose" is the dose of dopant atoms that are implanted via the first surface 121 into the semiconductor layer 120 in the respective implantation process. The "dose" is the number of dopant atoms per square unit of the first surface 121. Usually, the dose is given in number of dopant atoms per square centimeters ($cm^2$).

Implanting the dopant atoms in each of the three implantation processes includes implanting the respective dopant atoms at a respective implantation energy. According to one example, one implantation process includes implanting the respective dopant atoms at one implantation energy, only. According to another example, one implantation process includes two or more sub-processes, wherein in each of the sub-processes a different implantation energy is used to implant the respective dopant atoms. In this example, the implantation dose of the respective implantation process is given by the sum of the implantation doses in the sub-processes.

Employing several sub-processes with different implantation energies is useful, in particular, when the semiconductor layer 120 is based on SiC. In SiC there is almost no diffusion of implanted dopant atoms, so that using different implantation energies in two or more sub-processes helps to distribute the implanted dopant atoms in the vertical direction of the semiconductor layer. Each implantation energy is associated with a certain depth into which the dopant atoms are implanted, wherein, for a given species of dopant atoms, the higher the implantation energy, the deeper the dopant atoms are implanted.

According to one example, a thickness of an SiC semiconductor layer 120 is selected from between 1 micrometer and 6 micrometers, and the implantation energy is selected from between 50 keV and 30 MeV. The "thickness" is the dimension of the semiconductor layer 120 in the vertical direction. According to one example, the first type dopant atoms are n-type dopant atoms and the second type dopant atoms are p-type dopant atoms. Examples of n-type dopant atoms (in SiC) include are phosphorous (P) or nitrogen (N) atoms. Examples of p-type dopant atoms (in SiC) include aluminum (Al) or boron (B) atoms.

According to one example, the implantation doses in the first, second and third implantation process are selected such that the fourth regions 42 and the sixth regions 43 are first type regions and the fifth regions 52 are second type regions. A "first type region" is a region that has an effective doping of the first type, and a "second type region" is a region that has an effective doping of the second type. The effective doping is given by the doping type of those dopant atoms that prevail in the respective region. Thus, in fourth regions 42 and the sixth regions 43 first type dopant atoms prevail and in the fifth regions 52 the second type dopant atoms prevail.

The amount of dopant atoms that are included in a respective region of the semiconductor layer 120 is given by the amount of dopant atoms that are included in the respective region due to the basic doping of the semiconductor layer 120 plus the amount of dopant atoms that are implanted. In the following, unless stated otherwise, "amount of dopant atoms" means the amount of implanted dopants atoms, which is usually much higher than the amount of dopant atoms resulting from the basic doping.

The amount of dopant atoms that are implanted into a respective region of the semiconductor layer 120 in a respective implantation process is given by the implantation dose multiplied with the area of the respective region in the first surface 121, wherein the area is given by the width multiplied with the length. The width is the dimension of the respective region in the first lateral direction x, and the length is the dimension of the respective region in the second lateral direction y. According to one example, the lengths of the individual regions 42, 43, 52 are significantly greater than the respective widths. In this case, the amount of dopant atoms in each of these regions can be represented by the amount of dopant atoms per length unit. "The amount of dopant atoms per length unit" is given by the implantation dose multiplied with the respective width. Unless stated otherwise, in the following, "amount of dopant atoms" denotes the amount of dopant atoms per length unit.

In the following, D1 denotes the (overall) dopant dose in the first implantation process, D2 denotes the overall dopant dose in the second implantation process, and D3 denotes the overall dopant dose in the third implantation process. Furthermore, N42 denotes the amount of dopant atoms in each of the fourth regions 41, N52 denotes the amount of dopant atoms in each of the fifth regions 52, and N43 denotes the amount of dopant atoms in each of the sixth regions 43. According to one example, the (overall) dopant doses in each of the first, second, and third implantation process is selected from between 1E11 $cm^{-2}$ and 1E13 $cm^{-2}$.

A width w42 of the fourth regions 42 equals a width w41 of the first implanted regions 41, so that the amount of dopant atoms in each of the fourth regions 42 is given by $$N42 = w42 \cdot (D1 + D2 + D3) = w41 \cdot (D1 + D2 + D3). \tag{1}$$

A width w52 of the fifth regions 52 equals a width w51 of the second implanted regions 51, so that the amount of dopant atoms in each of the fifth regions 52 is given by $$N52 = w52 \cdot (D2 + D3) = w51 \cdot (D2 + D3). \tag{2}$$

The amount of dopant atoms in the sixth regions 43 is given by $$N43 = w43 \cdot D3, \tag{3}$$

wherein w43 denotes a width of the sixth regions 43.

Each of the fourth, fifth and sixth regions 42, 52, 43 has an effective implantation dose, which can be defined as the magnitude of the difference between the sum of the first type implantation doses and the sum of the second type implantation doses. Thus, an effective implantation dose $D42_{eff}$ of the fourth regions 42 is given by $$D42_{eff} = |(D1 + D3) - D2|, \tag{4}$$

an effective implantation dose $D52_{eff}$ of the fifth regions 52 is given by $$D52_{eff} = |D3 - D2|. \tag{5}$$

and an effective implantation dose $D43_{eff}$ of the sixth regions 43 is given by $$D43_{eff} = D3(6). \tag{6}$$

The effective implantation dose is a first type implantation dose if the sum of the first type implantation doses prevails the sum of the second type implantation doses, and the effective implantation dose is a second type implantation dose if the sum of the second type implantation doses prevails the sum of the first type implantation doses.

According to one example, the first, second and third implantation doses D1, D2, D3 are selected such that the effective implantation doses $D42_{eff}$, $D43_{eff}$ of the fourth and sixth regions 42, 43 are first type implantation doses and the effective implantation dose $D52_{eff}$ of the fifth regions 52 is a second type implantation dose. In this case, the amount of first type dopant atoms in each of the fourth and sixth regions 42, 43 prevails the amount of second type dopant atoms, so that the fourth and sixth regions 42, 43 each have an effective doping of the first doping type and each form at least a section of a respective first region 4 of the finished transistor device. Furthermore, the amount of second type dopant atoms in each of the fifth regions 52 prevails the amount of first type dopant atoms, so that the fifth regions 52 each have an effective doping of the second doping type and each form at least a section of a respective second region 5 of the finished transistor device.

Referring to the above, the first regions 4 of the transistor device shown in FIG. 1 are first type regions and the second regions 5 are second type regions. Furthermore, in the method according to FIGS. 4A-4E, the fourth and sixth regions 42, 43 are first type regions and the fifth regions 52 are second type regions, so that so that the fourth and sixth regions 42, 43 may form (at least a section) of a respective first region 4 and the fifth regions 52 may form (at least a section) of a respective second region 5 of the transistor device. This, however, is only an example. It is also possible to implement the transistor device such that the first regions 4 are second type regions and the second regions 5 are first type regions. In this case, the fourth and sixth regions 42, 43 may form (at least a section) of a respective second region 5 and the fifth regions 52 may form (at least a section) of a respective first region 4 of the transistor device. Thus, in the finished transistor device, each of the fourth and sixth regions 42, 43 may form (at least a section) of one of a first region 4 and a second region 5, and each of the fifth regions 52 may form (at least a section) of the other one of the first region 4 and the second region 5.

An effective implantation dose $D42_{eff}$ of the first type of the fourth regions 42 can be achieved by adjusting the first, second and third implantation doses D1, D2, D3 such that the sum of the first and third implantation doses D1, D3 is greater than the second implantation dose D2, $$D1 + D3 > D2. \tag{7}$$

An effective implantation dose $D52_{eff}$ of the second type of the fifth regions 52 can be achieved by adjusting the second and third implantation doses D2, D3 such that the second implantation dose D2 is greater than the third implantation dose D3, $$D2 > D3. \tag{8}$$

In a superjunction transistor device, suitably adjusting a ratio between the effective amount of first type dopant atoms in the first regions 4 and the effective amount of second type dopant atoms in the second regions 5 is essential to achieve a proper functionality. In the drift region section formed by the semiconductor layer 120 according to FIG. 4E, a ratio R between the effective amount of first type dopant atoms in the first regions 4 and the effective amount of second type dopant atoms in the second regions 5 can be expressed as $$R = \frac{N42_{eff} + N43_{eff}}{2 \cdot N52_{eff}}, \tag{9a}$$

wherein $N42_{eff}$ denotes the effective amount of first type dopant atoms in the fourth regions 42, $N52_{eff}$ denotes the effective amount of second type dopant atoms in the fifth regions 52, and $N43_{eff}$ denotes the effective amount of first type dopant atoms in the sixth regions 52. The effective amount of dopant atoms is given by the respective width multiplied with the respective effective implantation dose, so that the ratio R according to equation (9a) can be expressed as $$R = \frac{w42 \cdot D42_{eff} + w43 \cdot D43_{eff}}{2 \cdot w52 \cdot N52_{eff}}. \tag{9b}$$

As can be seen from equation (9b), the ratio R can be adjusted by suitably adjusting the widths w42, w52, w43 of the respective fourth, fifth, and sixth regions 42, 52, 43 and the first, second and third implantation doses D1, D2, D3.

According to one example, the first and second implantation doses D1, D2 are at least approximately equal. "At least approximately equal", according to one example, includes that the magnitude of a difference between the first implantation dose D1 and the second implantation dose is less than 1%, less than 0.5%, or less than 0.1% of an average of the first and second implantation dose D1, D2. In this case, the effective implantation dose of the fourth regions D42$_{eff}$ at least approximately equals the third implantation dose D3, so that the ratio R is given by $$R = \frac{(w42 + w43) \cdot D3}{2 \cdot w52 \cdot |D3 - D2|}. \tag{10a}$$

This ratio R is only dependent on the second and third implantation doses D2, D3, the sum of widths w42, w43 of a fourth and a sixth region 42, 43 and the width w52 of the fifth regions 52. The width w42 of the fourth regions 42 equals the width w41 of the first regions w41 and equals the width of the first w202 of the first openings 202, w42=w41=w202; the width w43 of the sixth regions 43 equals the width w203 of the second mask regions 203, w43=w203; and the overall width of two fifth regions 52 equals the width w204 of the second opening 204 minus the width of the first opening, 2·w52=w204−w202. Based on this, the ratio R according to equation (10a) may also be expressed as $$R = \frac{(w202 + w203) \cdot D3}{(w204 + w202) \cdot |D3 - D2|}. \tag{10b}$$

In the following, p denotes a pitch of the structure with the first openings 202 and the second mask regions 203 of the implantation mask shown in FIG. 4A, wherein $$p = w202 + w203. \tag{11}$$

According to one example, the pitch p is selected from between 2 micrometers and 16 micrometers. The width w42 of the fourth regions 42 equals the width w202 of the first openings 202. Due to variations in the manufacturing process of the first openings 202 a width w202 of these openings may deviate from a desired width w202$_0$, so that $$w202 = w202_0 + \Delta d, \tag{12a}$$

and $$w42 = w42_0 + \Delta d, \tag{12b}$$

where w202$_0$ and w42$_0$ denote a desired width of the first openings 202 and the first and fourth implanted regions 41, 42, respectively, and Δd denotes an undesired first deviation in the width. Ad may vary between −20% and +20%, in particular between −10% and +10% of w202$_0$ and w41$_0$, respectively. The width w52 of the fifth regions 52 is given by the width of the material that is removed from the first mask regions 201 in the process of increasing the width of the first openings. The width w52 is given by $$w52 = w52_0 + \Delta b, \tag{13}$$

where w52$_0$ denotes a desired width and Ab denotes an undesired second deviation that results from the process of increasing the width of the first openings. One example of a process for increasing the width of the first openings 202 is explained herein further below.

It can be shown that in the process according to FIGS. 4A-4E, the ratio R as given by equation (10) is dependent on the second deviation Δb and independent on the first deviation Δd. This is beneficial, because processes of increasing the width of the first openings 202 can be controlled better than processes for forming the first openings 202, so that the second deviation Δb may be smaller than the first deviation, Δb<Δd. Δb is about 25% of Δd, for example.

The sixth regions 43 result from implanting the first type dopant atoms in the third implantation process into those sections 60 of the semiconductor layer 120 that have the basic doping. Thus, the effective implantation dose of the sixth regions 43 equals the third implantation dose D3. Thus, when the first and second implantation doses D1, D2 are at least approximately equal, the effective implantation dose of the fourth regions 42 at least approximately equals the effective implantation dose of the sixth regions 43.

Referring to FIGS. 4A-4E, the width w43 of the sixth regions equals the width w203 of the second mask regions 203 and is given by $$w43 = w203 = p - (w42 - 2 \cdot w52) = p - (w42_0 + \Delta d - 2 \cdot (w52_0 + \Delta b)). \tag{14}$$

Using equations (12b), (13), and (14) the ratio R according to equations (10a) and (10b) can be expressed as $$R = \frac{(p - 2 \cdot (w52_0 + \Delta b)) \cdot D3}{2 \cdot (w52_0 + \Delta b) \cdot |D3 - D2|}, \tag{15}$$

which is independent of the first deviation Δd. Based on equation (15), which is based on the assumption that the first implantation dose D1 at least approximately equals the second implantation dose D2, it can be seen that the ratio R, which defines a balance of dopant atoms in the drift region of the finished transistor device, can be adjusted by suitably selecting w52$_0$ relative to the pitch and by suitably selecting the second and third implantation doses D2, D3.

According to one example R is between 0.8 and 1.2. That is, the widths w42, w52, w43 of the fourth, fifth and sixth regions 42, 52, 43, and the second and third dopant doses D2, D3 according to equation (10a) are adapted to one another such that $0.8 \leq R \leq 1.2$; the width w202 of the first openings 202, the width w203 of the second mask regions 203, the width w204 of the second openings 204, and the first and the second and third dopant doses D2, D3 according to equation (10b) are adapted to one another such that $0.8 \leq R \leq 1.2$; or the pitch p, the width w52 of the fifth regions 52, and the second and third dopant doses D2, D3 according to equation (15) are adapted to one another such that $0.8 \leq R \leq 1.2$.

According to one example, the widths w42, w52, w43 are at least approximately equal, that is $w42 \approx w43 \approx w52$. In this case, $0.8 \leq R \leq 1.2$ may be achieved by adapting the second and third implantation doses D2, D3 to one another such that the third implantation dose is selected from between 40% and 60% of the second implantation dose D2. According to one example, the third implantation dose is selected from between 45% and 65% of the second implantation dose D2.

According to one example, $w52_0$ is selected to be 25% of the pitch p. In this case, the ratio R is given by $$R = \frac{(0.5 \cdot p - 2 \cdot \Delta b) \cdot D3}{(0.5 \cdot p - 2 \cdot \Delta b) \cdot |D3 - D2|} \quad (16)$$

and can be adjusted by suitably adjusting the second and third implantation doses D2, d3. According to one example, the third implantation dose D3 is at least approximately 50% of the second implantation dose $D3 \approx 0.5 \cdot D2$. In this example, the first type regions 4 and the second regions 5 are essentially balanced and $R \approx 1$. This, however, is only an example. According to another example, the third implantation dose D3 is less than 50% of the second implantation dose $D3 < 0.5 \cdot D2$. In this example, the number of second type dopant atoms prevail and $R < 1$. According to yet another example, the third implantation dose D3 is more than 50% of the second implantation dose $D3 > 0.5 \cdot D2$. In this example, the number of first type dopant atoms prevail and $R > 1$. According to one example, the third implantation dose is selected from between 40% and 60% or from between 45% and 65% of the second implantation dose D2.

Referring to the above, the drift region 2 of the superjunction device may include one drift region section formed in accordance with the method according to FIGS. 4A-4E or may include several drift region sections formed in accordance with the method according to FIGS. 4A-4E.

Figure 5:
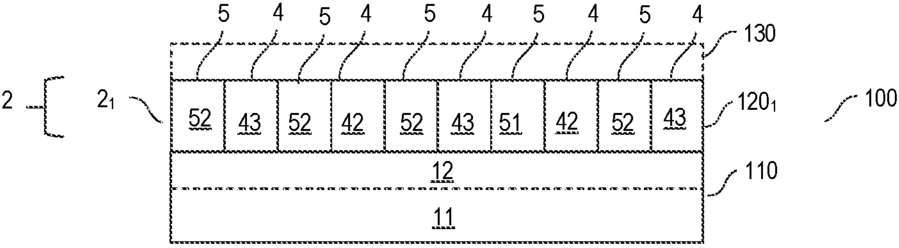
FIG. 5 shows a vertical cross sectional view of a semiconductor body including a drift region section formed in accordance with the method according to FIG. 3.

FIG. 5 shows one example of the semiconductor body 100 of a superjunction device, wherein this semiconductor body includes a drift region 2 that includes only one drift region section $\mathbf{2}_1$ formed in accordance with the method according to FIGS. 4A-4E. In addition to a semiconductor layer $\mathbf{120}_1$ of the drift region section $\mathbf{2}_1$, the semiconductor body 100 includes a carrier layer 110 on top of which the semiconductor layer $\mathbf{120}_1$ has been formed. According to one example, the semiconductor layer is an epitaxial layer grown on the carrier layer. Referring to FIG. 5, the carrier layer 110 includes the further semiconductor region 11 and, optionally, the buffer region 12, of the finished superjunction device. According to one example, the carrier layer 110 includes a semiconductor substrate that forms the further semiconductor region 11. The optional buffer region 12 may be formed by an epitaxial layer grown on the substrate. According to one example, the "semiconductor substrate" is a piece of monocrystalline semiconductor material cut from an ingot.

Referring to FIG. 5, the semiconductor body 100 may further include a top layer 130 that is epitaxially grown on the semiconductor layer $\mathbf{120}_1$ of the drift region section $\mathbf{2}_1$. This top layer 120 may be used to implement the head structure 3 (see FIG. 1). This, however, is only an example. According to another example, the top layer 130 is omitted and the head structure 3 is formed in an upper section of the semiconductor layer $\mathbf{120}_1$ of the drift region section $\mathbf{2}_1$.

Figure 6:
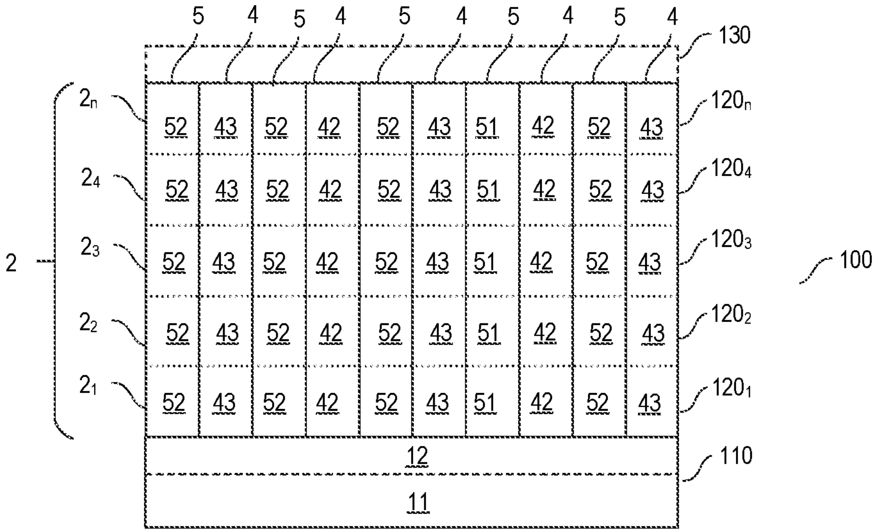
FIG. 6 shows a vertical cross sectional view of a semiconductor body including several drift region sections formed in accordance with the method according to FIG. 3.

FIG. 6 shows a modification of the semiconductor body 100 shown in FIG. 5. The semiconductor body 100 according to FIG. 6 is different from the semiconductor body 100 according to FIG. 5 in that it includes several drift region sections $\mathbf{2}_1$-$\mathbf{2}_n$ that are arranged one above the other on top of the carrier layer 110. Each of these drift region sections $\mathbf{2}_1$-$\mathbf{2}_n$ is produced in accordance with the method according to FIG. 3 and FIGS. 4A-4E and includes a respective semiconductor layer $\mathbf{120}_1$-$\mathbf{120}_n$. The individual drift region sections $\mathbf{2}_1$-$\mathbf{2}_n$ are produced such that first type regions are arranged one above the other to form a respective first region 4 and second type regions are arranged one above the other to form a respective second region 5. According to one example, the semiconductor body includes between 5 and 15 drift region sections (n is selected from between 5 and 15).

Figure 7A:
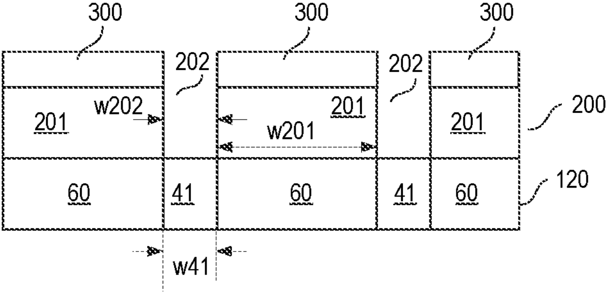
FIGS. 7A-7B illustrates one example of a method for laterally etching an implantation mask.
Figure 7B:
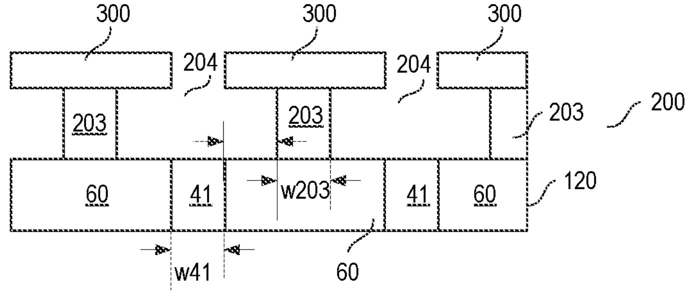

FIGS. 7A-7B illustrate one example of a method for increasing the size of the first openings 202 and reducing the size of the first mask regions 201, wherein each of FIGS. 7A and 7B shows a vertical cross sectional view of a section of the semiconductor layer 120 and the implantation mask 200 during the processing.

Referring to FIG. 7A, the method includes forming a protection layer 300 on top of the first mask regions 201 such that top surfaces of the first mask regions 201 are covered by the protection layer 300 and sidewalls of the first mask regions 201 are not covered by the protection layer 300, wherein the sidewalls of the first mask regions 201 form the first openings. According to one example, the protection layer 300 is a polysilicon layer.

According to one example, forming the implantation mask 200 and the protection layer 300 on top of the mask regions 201 includes depositing an implantation mask layer, such as an oxide layer; depositing a protection layer, such as a polysilicon layer, on top of the implantation mask layer; and forming the first openings 202 such that they extend through the protection layer and the implantation mask layer. In this way, the protection layer 300 and the implantation mask 200 are patterned in the same process, so that the protection layer 300 covers the mask regions 202 of the implantation mask 200. Patterning the protection layer 300 and the implantation mask 200, that is, forming the first openings 202, may include forming a patterned photoresist on top of the protection layer and etching the protection layer and the implantation mask layer using the patterned photoresist as an etch mask.

Referring to FIG. 7B, the method further includes an etching process in which the first mask regions 201 are laterally etched beginning at the sidewalls of the first openings 202 in order to reduce the size of the first mask regions 201 and increase the size of the first openings 202. According to one example, the etching process is an isotropic etching process. Referring to FIG. 7A, the first mask regions 201 have a first mask region width w201 before the etching process, and the second mask regions 203 resulting from the first mask regions 202 in the etching process have a second mask region width w203. According to one example, the first mask regions 201 are etched symmetrically, so that a width of the removed material is essentially the same on both sides of the mask regions 201. The width of the material that is removed on each side defines the width w51 of the third implanted regions 51 and, as explained with reference to FIGS. 4B-4E, the width of the sixth regions 43.

This width w51 can be adjusted by adjusting the duration of the etching process, wherein the longer the duration of the etching process, the greater the width w51.

Although the figures explained before and in the following show only one section of a semiconductor body 100 or a semiconductor layer 120 during processing, it should be noted that process steps and process sequences explained with reference to these figures can take place on a wafer level. That is, the carrier layer 110 and the at least one semiconductor layer 120, $\mathbf{120}_1$, $\mathbf{120}_1$-$\mathbf{120}_n$ formed on top of the carrier layer 110 may be part of a semiconductor wafer 1, wherein this wafer 1 is separated to obtain a plurality of identical dies (semiconductor bodies) at the end of the manufacturing process.

Figure 8:
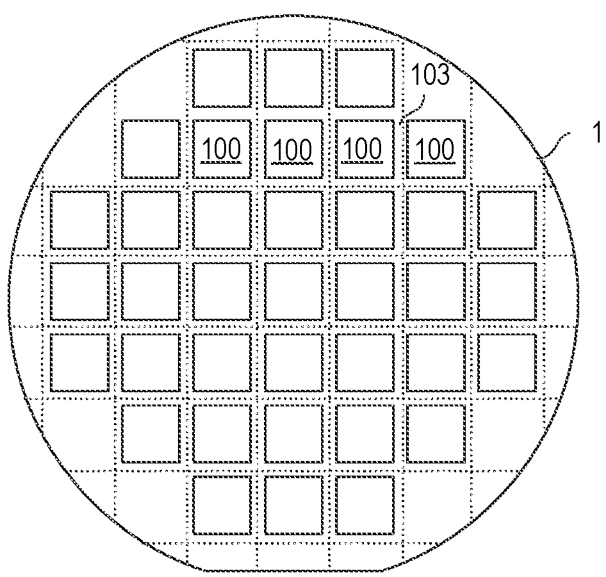
FIG. 8 schematically illustrates a wafer that includes a plurality of semiconductor bodies.

FIG. 8 schematically illustrates a top view of a semiconductor wafer 1 that includes a plurality of semiconductor bodies 100. Dotted lines 103 shown in FIG. 8 illustrate those lines along which the wafer 1 can be separated after the processing in order to obtain the plurality of single semiconductor dies. Sections that include these cutting lines 101 are usually referred to as kerf.

Referring to the above, the width w51 (=w$\mathbf{51}_0$+Δb) of the fifth regions 52 may deviate from a desired width w$\mathbf{51}_0$ due to variations in the process of increasing the size of the first openings 202 and decreasing the size of the first mask regions 201. Referring to equation (16), for example, the second deviation Δb resulting from these variations affects the ratio R between the amount of dopant atoms in the first and second regions 4, 5. If Ab is positive, the higher the magnitude of Ab, the lower R. If Ab is negative, the higher the magnitude of Ab, the higher R.

Referring to equation (16), for example, the ratio R is dependent on a difference between the second implantation dose and the third implantation dose. In the event that the second deviation Δb is known, an error in the ratio R that results from the second deviation Δb can at least approximately be compensated by suitably adjusting the third implantation dose D3 in the third implantation process.

FIGS. 9A-9D illustrate one example for measuring w51 and, therefore, for measuring the second deviation Δb. Referring to FIGS. 9A and 9B, the method includes forming a step 122 in the semiconductor layer 120 such that the step 122 is aligned with the sidewall of a mask region 201'. This mask region 201' is of the same type as the first mask regions 201 explained above, but does not necessarily have the same width as the first mask regions 201. The step 122 may be formed in the kerf 103 of the wafer, so that the section of the semiconductor layer 120 that includes the step 122 and adjoining regions may be removed when dividing the wafer. The step 122 is formed after the first implantation process between a section of the semiconductor layer 120 that is covered by the mask region 201' and a section 41' that is not covered by the implantation mask 200 and into which dopant atoms are implanted in the first implantation process. This section 41' is referred to as edge section in the following.

Forming the step 122 shown in FIG. 9B may include forming a protection layer 400 such that the protection layer 400 covers the semiconductor layer 120 in the first openings 202 and does not cover the semiconductor layer 120 in the edge section 41'. Furthermore, forming the step may include etching the edge section in anisotropic etching process so that the step 122 is formed below the sidewall of the mask region 201'.

FIG. 9C shows the semiconductor layer 120 and the implantation mask 200 after the etching process explained with reference to FIG. 7B, and FIG. 9D shows the semiconductor layer 120 according to FIG. 9C after removing the protection layer 300. During the etching process, the mask region 201' that adjoins the step 122 is laterally etched in the same way as the first mask regions 201 and results in a reduced mask region 203'. A distance dl between the step 122 and the reduced mask region 203' equals the width w51, wherein this distance dl can be measured using a laser measurement device, for example. Based on measuring the distance dl and based on the desired width w$\mathbf{51}_0$ of the fifth regions 52 the second deviation Δb can be obtained.

The second deviation Δb obtained by the process according to FIGS. 9A-9D may be used, as explained above, to suitably adjust the ratio R. Alternatively or additionally, the second deviation Δb obtained by the process according to FIGS. 9A-9D may be used to adjust the duration in a next etching process, such as an etching process in the process of forming a further drift region section on the same wafer.

According to another example, the etching process includes a first sub-process in which the mask regions 201, 201' are etched to a certain extent; measuring the distance dl between the step 122 and mask region 201'; and a second sub-process in which the mask regions 201, 201' are etched further, wherein a duration of the second sub-process is dependent on the measured distance.

Figure 10:
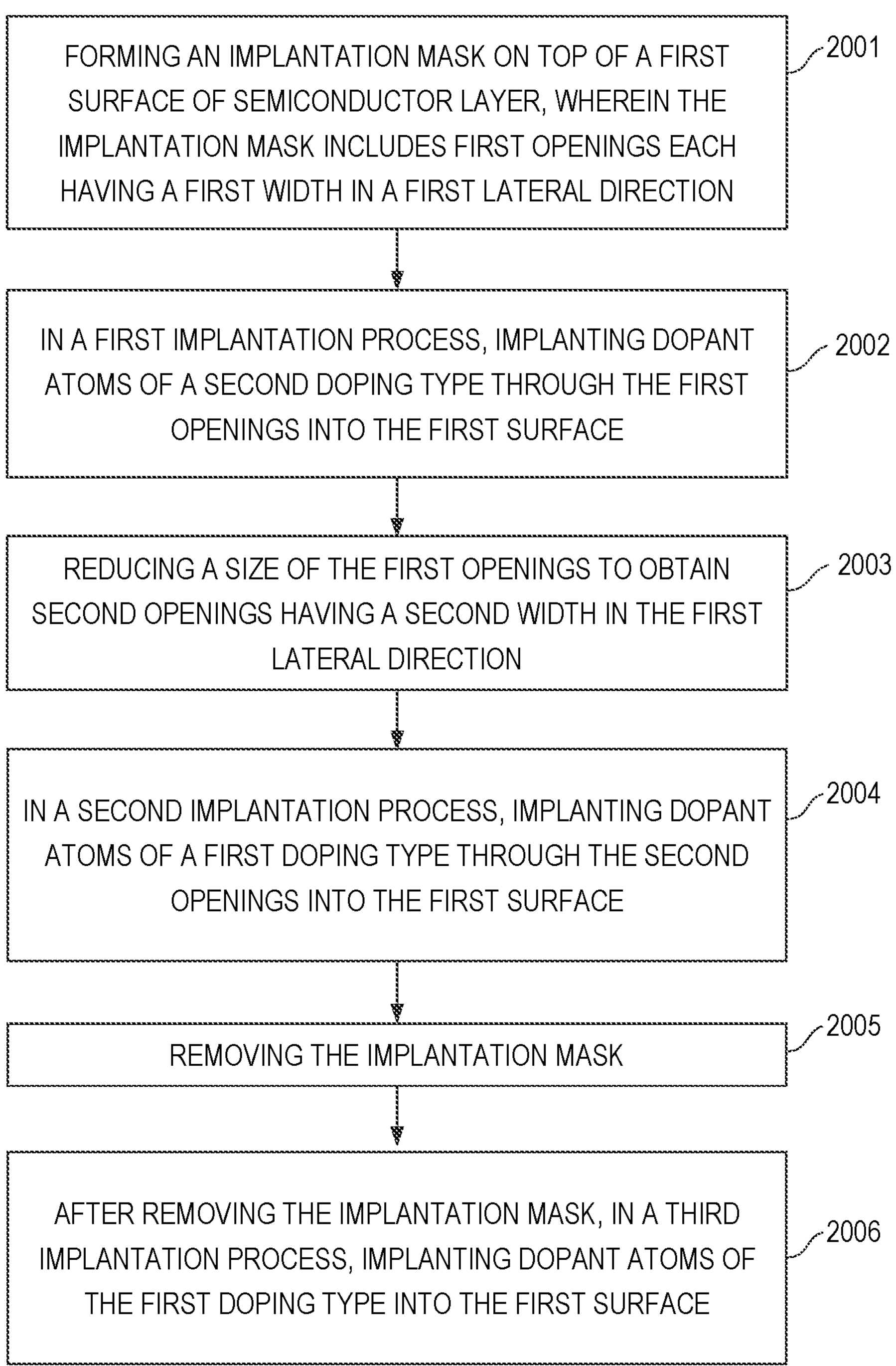
FIG. 10 shows a flowchart of a further example of a method for forming one or more drift region sections of the drift region.

FIG. 10 illustrates a flow chart of a further example of a method for forming a drift region section that includes a semiconductor layer with first regions of a first doping type and second regions of a second doping type, wherein the first regions and the second regions are arranged alternatingly in a first lateral direction of the semiconductor layer. Referring to FIG. 10, the method includes forming an implantation mask on top of a first surface of the semiconductor layer, wherein the implantation mask includes first openings that each have a first width in the first lateral direction (2001). The method further includes, in a first implantation process, implanting dopant atoms of a second doping type through the first openings into the first surface (2002), reducing a size of the first openings to obtain second openings having a second width in the first lateral direction (2003), and, in a second implantation process, implanting dopant atoms of a first doping type through the second openings into the first surface 2004. Furthermore, the method includes removing the implantation mask (2005) and, after removing the implantation mask, in a third implantation process, implanting dopant atoms of the first doping type into the first surface (2006).

Figure 11A:
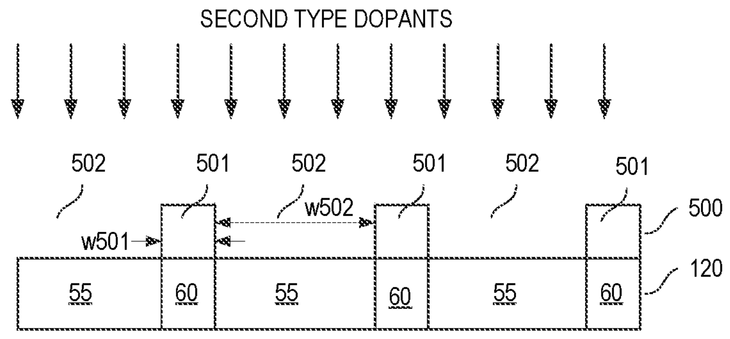
FIGS. 11A-11C show a vertical cross sectional view of a semiconductor layer during process sequences according to FIG. 10.
Figure 11B:
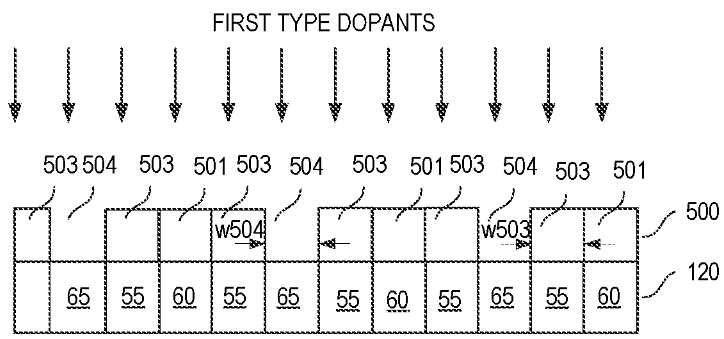
Figure 11C:
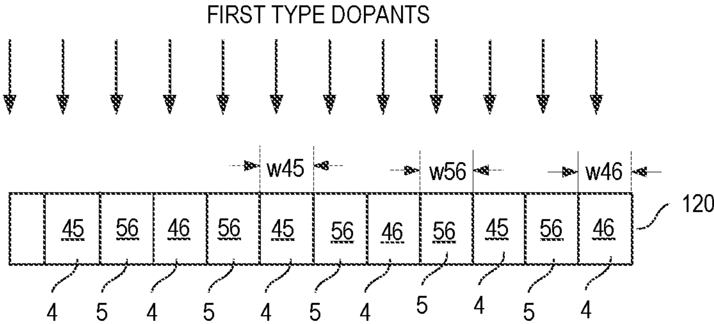

FIGS. 11A-11C illustrate the process steps according to FIG. 10 in greater detail. More specifically, FIGS. 11A-11C each show a vertical cross sectional view of one section of the semiconductor layer 120 during the manufacturing process according to FIG. 10.

Referring to FIG. 11A, the method includes forming an implantation mask 500 on top of the first surface 121 of the semiconductor layer 120. The implantation mask 500 includes openings 502 that have a first width w502 in the first lateral direction x and first mask regions 501 between the first openings 502, wherein the mask regions 501 have a first width w501 in the first lateral direction x. Referring to FIG. 11A, dopant atoms of the second doping type are implanted through the first openings 502 of the implantation mask 500 into the semiconductor layer 120 in a first implantation process. In the first implantation process, first implanted regions 55 that include dopant atoms of the second doping type are formed in those regions of the semiconductor layer 120 below the openings 502 of the implantation mask 500. Regions 60 below the mask regions 501 are not affected by the implantation process, so that these regions 60, after the first implantation process, have a doping concentration that essentially equals a basic doping of the semiconductor layer 120. According to one example, the semiconductor layer 120 is an intrinsic layer or a lightly doped layer, so that the basic doping concentration is below 1E17 $cm^{-3}$, below 1E15 $cm^{-3}$ or even below 1E14 $cm^{-3}$.

Referring to FIG. 11B, the method further includes reducing a size of the first openings 502 to form second openings 504 wherein a width w504 of these second openings 504 is lower than a width w502 of the first openings 502 (w504<w502). Reducing the size of the first openings 502 includes adding material to the mask regions 501 in the first lateral direction x. One example of a method for adding material to the first mask regions 501 is explained in detail herein further below.

Referring to FIG. 11B, the method further includes, in a second implantation process, implanting first type dopant atoms through the second openings 504 into the semiconductor layer 120. This second implantation process forms second implanted regions 65. The second implanted regions 65 result from the first implanted regions 55 by additionally implanting the first type dopant atoms in the second implantation process.

Referring to FIG. 11C, the method further includes removing the implantation mask 500 and blanket implanting dopant atoms of the first doping type into the surface 121 of the semiconductor layer 120 in a third implantation process. This third implantation process results in third implanted regions 45, fourth implanted regions 56 and fifth implanted regions 46. The third implanted regions 45 result from implanting the first type dopant atoms into the second implanted regions 65, the fourth implanted regions 56 result from implanting the first type dopant atoms into those sections of the first implanted regions 55 that are covered during the second implantation process, and the fifth implanted regions 56 result from implanting the first type dopant atoms into those sections of the semiconductor layer that are covered during the first implantation process and the second implantation process.

In the drift region section according to FIG. 11C, each of the third and fifth regions 45, 46 forms at least a section of a first region 4 of the drift region. Furthermore, each of the fourth regions 56 forms at least a section of a second region 5 of the drift region. This, however, is only an example. It is also possible to implement the transistor device such that the first regions 4 are second type regions and the second regions 5 are first type regions. In this case, the third and fifth regions 45, 46 may form (at least a section) of a respective second region 5 and the fourth regions 56 may form (at least a section) of a respective first region 4 of the transistor device. Thus, in the finished transistor device, each of the third and fifth regions 45, 46 may form (at least a section) of one of a first region 4 and a second region 5, and each of the fifth regions 52 may form (at least a section) of the other one of the first region 4 and the second region 5.

According to one example, a first implantation dose D21 in the first implantation process at least approximately equals a second implantation dose D22 in the second implantation process, so that the effective implantation dose is zero and an effective doping of the second implanted regions 65 is given by the basic doping of the semiconductor layer 120. In this case, the third implanted regions 45 and the fifth implanted regions 46 have the same effective implantation dose, which is given by a third implantation dose D23 in the third implantation process. The first implantation dose D21 in the first implantation process and the third implantation dose D23 in the third implantation process are adapted to one another such that the fourth regions 56 have an effective doping of the second doping type.

In the drift region section 120 according to FIG. 11C, the ratio R between the effective amount of first type dopant atoms in the first regions 4 and the effective amount of second type dopant atoms in the second regions 5 can be expressed as $$R = \frac{(w45 + w46) \cdot D23}{2 \cdot w56 \cdot |D23 - D21|}, \tag{17a}$$

wherein w45 denotes a width of the third regions 45, w46 denotes a width of the fifth regions 46, w56 denotes a width of the fourth regions 56, D21 denotes the first implantation dose, and D23 denotes the third implantation dose. This ratio R is only dependent on the first and third implantation doses D21, D23, the sum of widths w45, w46 of a fourth and a sixth region 45, 46 and the width w56 of the fifth regions 56. The width w45 of the fourth regions 45 equals the width of the second regions 65 and equals the width w504 of the second openings w504; the width w46 of the fifth regions 46 equals the width w501 of the first mask regions 501; and the width w56 of the fourth regions 56 equals the width w503 of the spacers 503. Based on this, the ratio R according to equation (17a) may also be expressed as $$R = \frac{(w504 + w501) \cdot D23}{2 \cdot w503 \cdot |D23 - D21|}. \tag{17b}$$

According to one example, the widths w45, w46, w56 and the first and third implantation doses D21, D23 according to equation (17a), or the widths w504, w501, w503 and the first and third implantation doses D21, D23 according to equation (17b) are adapted to one another such that the ratio R is between 0.8 and 1.2, $0.8 \leq R \leq 1.2$.

According to one example, the widths w45, w46, w56 are at least approximately equal, that is, w45≈w46≈w56. In this case, $0.8 \leq R \leq 1.2$ may be achieved by adapting the second and third implantation doses to one another such that the third implantation dose D23 is selected from between 40% and 60% of the first implantation dose D21. According to one example, third implantation dose D23 is selected from between 45% and 65% of the first implantation dose D21.

Figure 12:
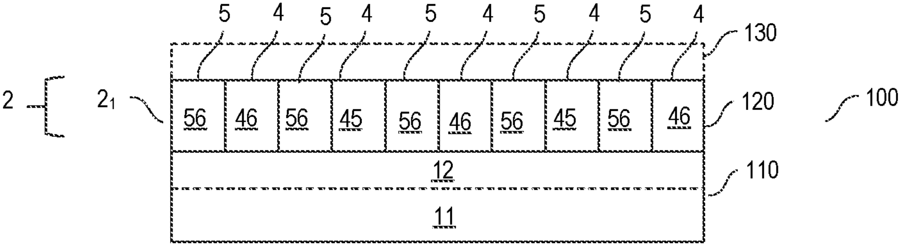
FIG. 12 shows a vertical cross sectional view of a semiconductor body including one drift region section formed in accordance with the method according to FIG. 10.

Referring to the above, the drift region 2 of the superjunction device may include one drift region section or may include several drift region sections. FIG. 12 shows one example of the semiconductor body 100 of a superjunction device, wherein this semiconductor body includes a drift region 2 that includes only one drift region section $\mathbf{2}_1$ formed in accordance with the method according to FIGS. 11A-11C. In addition to a semiconductor layer $\mathbf{120}_1$ of the drift region section $\mathbf{2}_1$, the semiconductor body 100 includes a carrier layer 110 on top of which the semiconductor layer $\mathbf{120}_1$ has been formed. Everything explained with regard to the carrier layer 110 shown in FIGS. 5 and 6 also applies to the carrier 110 according to FIG. 12.

Figure 13:
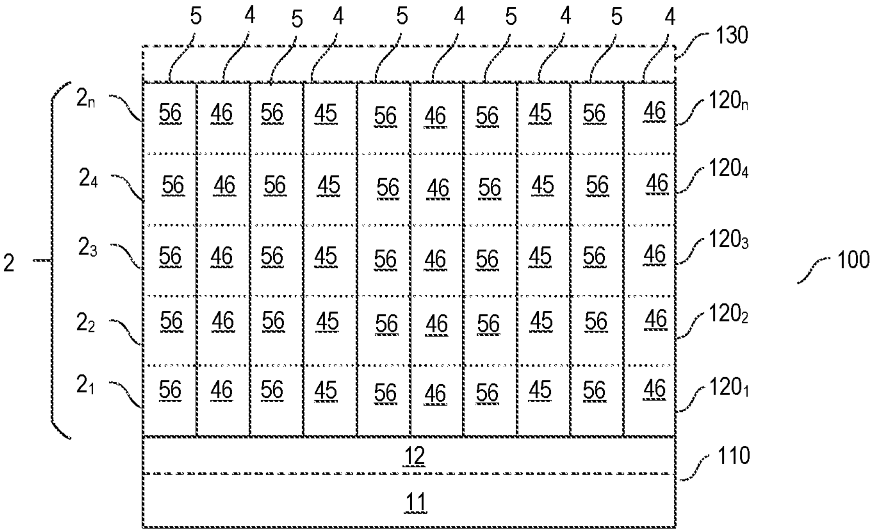
FIG. 13 shows a vertical cross sectional view of a semiconductor body including one several drift region sections formed in accordance with the method according to FIG. 10.

FIG. 13 shows a modification of the semiconductor body 100 shown in FIG. 12. The semiconductor body 100 according to FIG. 13 is different from the semiconductor body 100 according to FIG. 12 in that it includes several drift region sections $\mathbf{2}_1$-$\mathbf{2}_n$ that are arranged one above the other on top of the carrier layer 110. Each of these drift region sections $\mathbf{2}_1$-$\mathbf{2}_n$ is produced in accordance with the method according to FIG. 10 and FIGS. 11A-11E and includes a respective semiconductor layer $\mathbf{120}_1$-$\mathbf{120}_n$. The individual drift region sections $\mathbf{2}_1$-$\mathbf{2}_n$ are produced such that first type regions are arranged one above the other to form a respective first region 4 and second type regions are arranged one above the other to form a respective second region 5.

Figure 14A:
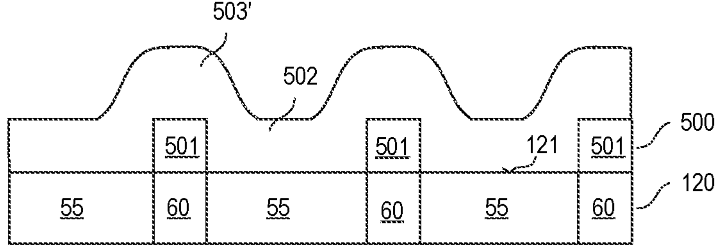
FIGS. 14A-14B illustrates one example of a method for reducing a size of openings in an implantation mask.
Figure 14B:
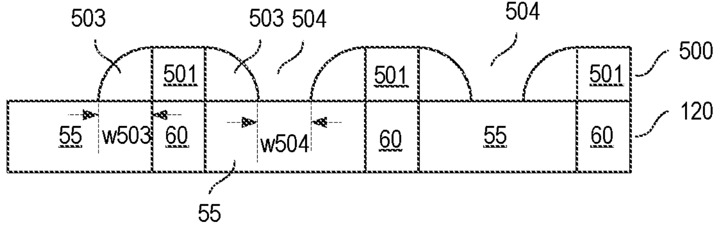

FIGS. 14A and 14B illustrate one example of a method for reducing the size of the first openings 502. Referring to FIG. 14A, this method includes forming an implantation mask layer 503' such that the implantation mask layer 503' covers the first surface 121 in the first openings 502 and covers the mask regions 501.

Referring to FIG. 14B, the method further includes an anisotropic etching process in which the implantation mask layer 503' is etched such that sections of the first surface 121 are uncovered to form the second openings 504. In this process, spacers 503 remain along sidewalls of the mask regions 501. These spacers add material to the sidewalls of the first mask regions 501, wherein the first mask regions 501 and the spacers 503 form second mask regions which are wider than the first mask regions 501. Consequently, a width w504 of the second openings 504 which remain after forming the spacers 503 is smaller than a width w502 of the first openings 502. A width w503 of each spacer 503 is essentially given by a thickness of the implantation mask layer 503', for example.

Figure 15:
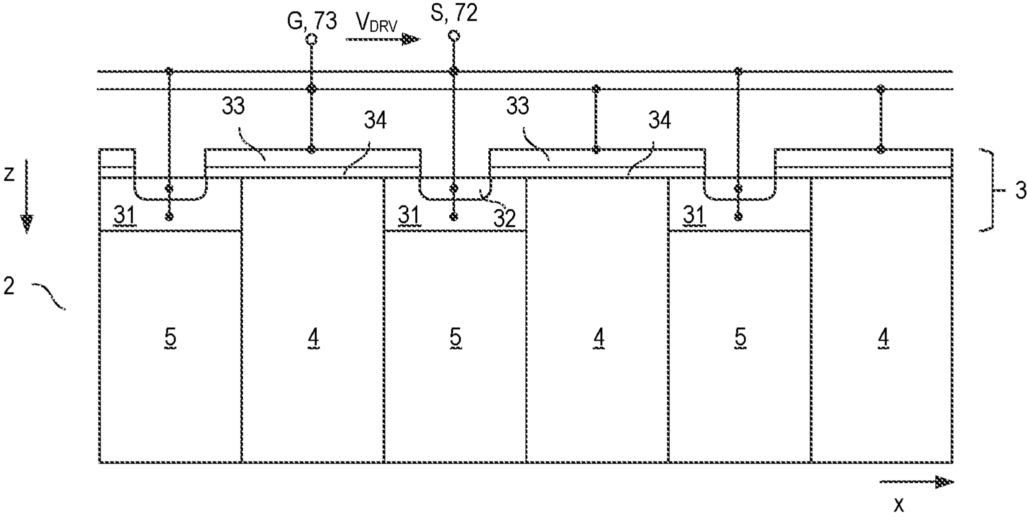
FIGS. 15-17 illustrate different examples of a head structure of a transistor device.

FIG. 15 shows one example of the head structure 3 of a superjunction transistor device in a greater detail. Besides the head structure 3, portions of the drift region 2 adjoining the head structure 3 are shown in FIG. 15. In the example shown in FIG. 15 the head structure 3 includes a plurality of control cells, which may also be referred to as transistor cells. Each of cells 30 includes a body region 31 of the second doping type, a source region 32 of the first doping type, a gate electrode 33, and a gate dielectric 34. The gate dielectric 34 dielectrically insulates that gate electrode 33 from the body region 31. The body region 31 of each cell 30 separates the respective source region 32 from at least one of the plurality of first regions 4. The source region 32 and the body region 31 of each of the plurality of cells 30 is electrically connected to the second load node 72, which forms a source node S of the transistor device. "Electrically connected" in this context means ohmically connected. That is, there is no rectifying junction between the source node S and the source region 32 and the body region 31. Electrical connections between the source node S and the source region 32 and the body region 31 of the individual control cells 30 are only schematically illustrated in FIG. 2. The gate electrode 33 of each control cell 30 is electrically connected to the control node 73, which forms a gate node G of the transistor device.

Referring to the above, the body region 31 of each cell adjoins at least one first region 4. As the body region 31 is of the second doping type and the first region 4 is of the first doping type there is a pn-junction between the body region 31 of each control cell 30 and the at least one first region 4. These pn-junctions form a pn-diode, which is sometimes referred to as body diode of the transistor device. The transistor device is in the reverse biased state when the load path voltage (drain-source voltage) between the first load node, which forms the drain node and is not shown in FIG. 15, and the source node S has a polarity that forward biases the body diode so that the transistor device conducts independent of the drive voltage (gate-source voltage) $V_{DRV}$ between the gate node G and the source node S.

The transistor device is in the forward biased state when the drain-source voltage reverse biases the body diode. In this case, the transistor device is in the conducting state when the gate-source voltage $V_{DRV}$ causes a conducting channel in the body regions 31 along the gate dielectrics 34 between the source regions 32 and the first regions 4. Furthermore, the transistor device is in the blocking state when the gate-source voltage $V_{DRV}$ is such that the conducting channel is interrupted.

In the example shown in FIG. 15, the gate electrode 33 of each cell is a planar electrode arranged on top of the first surface 101 of the semiconductor body 100 and dielectrically insulated from the semiconductor body 100 by the gate dielectric 34. In this example, sections of the first regions 4, adjacent the individual body regions 31, extend to the first surface 101.

Figure 16:
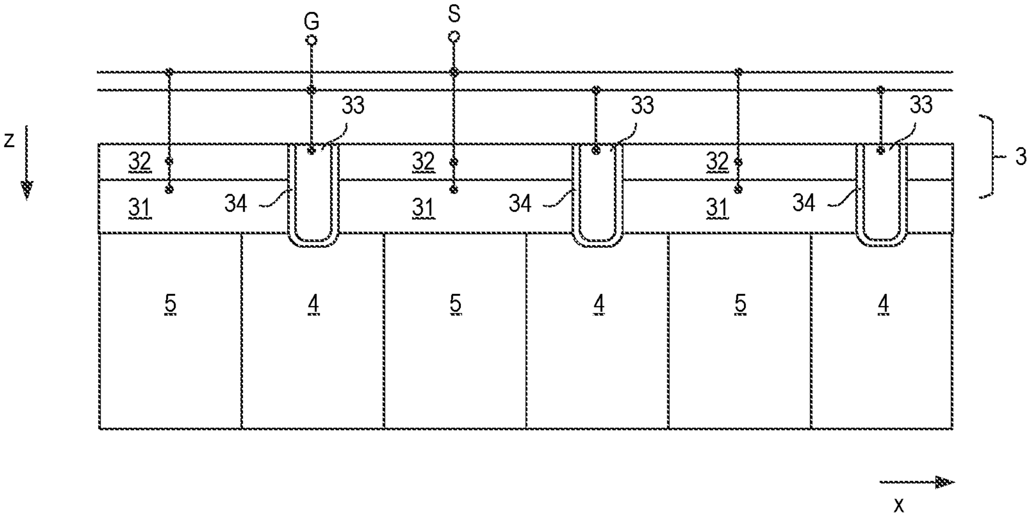

FIG. 16 shows a head structure 3 according to another example. The head structure 3 shown in FIG. 3 is different from the head structure 3 shown in FIG. 2 in that the gate electrode 33 of each cell is a trench electrode. This gate electrode 33 is arranged in a trench that extends from the first surface 101 into the semiconductor body 100. Like in the example shown in FIG. 15, a gate dielectric 34 dielectrically insulates the gate electrode 33 from the respective body region 31. The body region 31 and the source region 32 of each control cell 30 are electrically connected to the source node S. Further, the body region 31 adjoins at least one first region 4 and forms a pn-junction with the respective first region 4.

In the examples shown in FIGS. 15 and 16, the cells each include one gate electrode 33, wherein the gate electrode 33 of each control cell 30 is configured to control a conducting channel between the source region 32 of the respective control cell 30 and one first region 4, so that each cell is associated with one first region 4. Further, as shown in FIGS. 15 and 16, the body region 31 of each cell adjoins at least one second region 5, so that the at least one second region 5 is electrically connected to the source node S via the body region 31 of the cell. Just for the purpose of illustration, in the examples shown in FIGS. 15 and 16, the body region 31 of each cell adjoins one second region 5 so that each cell is associated with one second region 5. Furthermore, in the examples, shown in FIGS. 15 and 16, the source regions 32 of two (or more) neighboring cells are formed by one doped region of the first doping type, the body regions 31 of two (or more) neighboring cells 30 are formed by one doped region of the second doping type, and the gate electrodes 33 of two (or more) cells 30 are formed by one electrode. The gate electrodes 33 may include doped polysilicon, a metal, or the like.

The source regions 32 and the body regions 31 may be produced by implanting dopant atoms via the first surface into the semiconductor body 100. According to one example, the source regions 32 are produced such that their doping concentration is higher than 1E19 $cm^{-3}$ and the body regions 31 are produced such that their doping concentration is between 1E17 $cm^{-3}$ and 1E18 $cm^{-3}$.

In addition to the body regions 31 and the second regions 5 the transistor device may include shielding regions (not shown) of the second doping type. A doping concentration of these shielding regions may be higher than the doping concentration of the body regions 31. The shielding regions adjoin the body regions 31 and/or the second regions 5 and extend into the first regions 4. The shielding regions and the first regions 4 form JFET (Junction Field Effect Transistor) like structures that protect the gate dielectrics 34 against high electric fields as the drain-source voltage in the blocking state increases. This is commonly known so that no further explanation is required in this regard.

Associating one cell of the plurality of cells with one first region 4 and one second region 5, as illustrated in FIGS. 15 and 16, is only an example. The implementation and the arrangement of the control cells of the head structure 3 are widely independent of the specific implementation and arrangement of the first regions 4 and the second regions 5.

Figure 17:
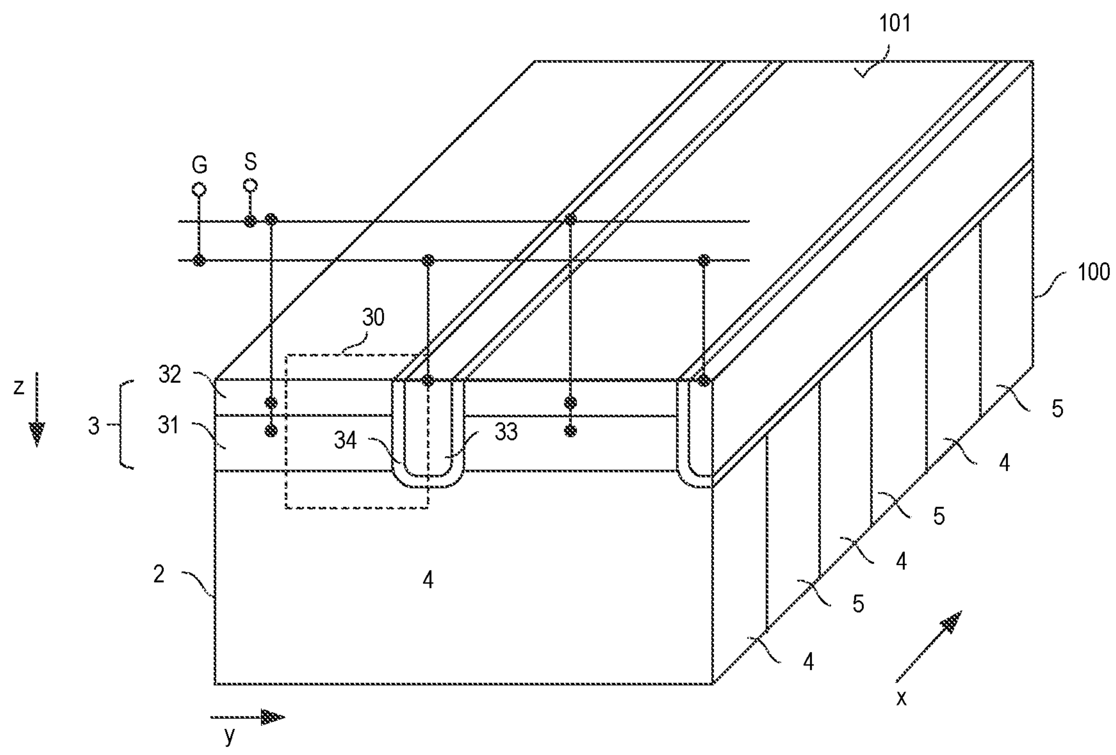

One example illustrating that the implementation and arrangement of the head structure 3 are widely independent of the implementation and arrangement of the first and second regions 4, 5 is shown in FIG. 17. In this example, the first regions 4 and the second regions 5 are elongated in the second lateral direction y of the semiconductor body 100, while the source regions 32, the body regions 31, and the gate electrodes 33 of the individual control cells 30 of the head structure 3 are elongated in the first lateral direction x perpendicular to the second lateral direction y. In this example, the body region 31 of one control cell 30 adjoins a plurality of first regions 4 and second regions 5.

The transistor device can be implemented as an n-type transistor device or as a p-type transistor device. In an n-type transistor device, the first doping type, which is the doping type of the first regions 4, the source regions 32, the drain region 11 and the optional buffer region 12 is an n-type and the second doping type, which is the doping type of the second regions 5 and the body regions 31, is a p-type. In a p-type transistor device, the doping types of the device regions mentioned before are complementary to the doping types of the respective device regions in an n-type transistor device.

Figure 18:
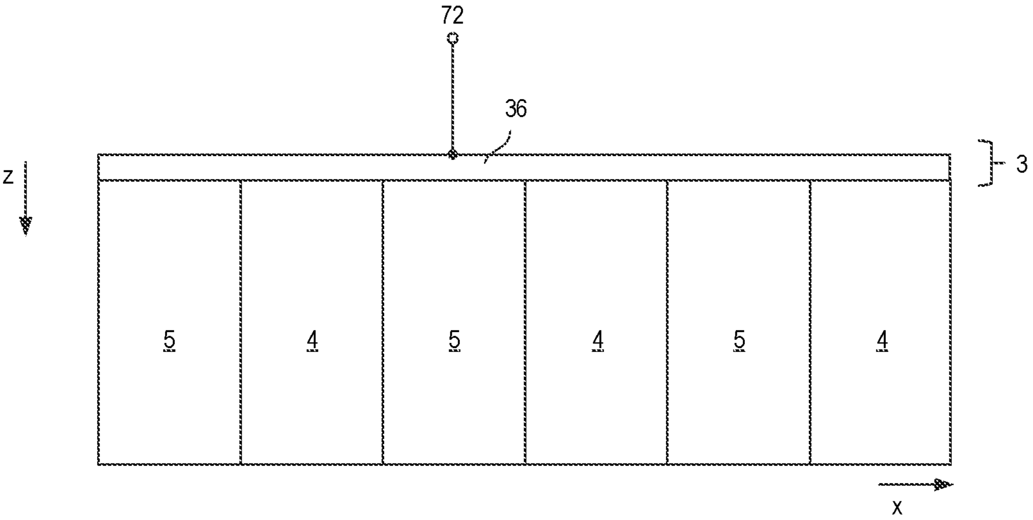
FIG. 18 illustrates one example of a head structure of a Schottky diode.

FIG. 18 illustrates one example of a head structure 3 of a Schottky diode. In this example, the head structure 36 includes a Schottky metal layer 36 that is connected to the second load node 72 and adjoins the first and second regions 4, 5. The Schottky metal layer 36 is such Schottky junctions are formed between the Schottky metal layer 36 and the first regions 4 and ohmic connections are formed between the Schottky metal layer 36 and the second regions 5. The Schottky metal layer may include at least one of platinum (Pt), titanium (Ti), nickel (Ni), chromium (Cr), molybdenum (Mo), tungsten (W).

The Schottky diode is in the conducting state, when the load path voltage has a polarity and magnitude that forward biases the Schottky junctions. Furthermore, the Schottky diode is in the blocking state, when the load path voltage has a polarity that reverse biases the Schottky junctions. The second load node 72 forms an anode node of the Schottky diode, and the first load node (not shown in FIG. 18) forms a cathode node of the Schottky diode.

Some of the aspects explained above are summarized in the following by way of numbered examples.

Example 1—A method including: forming at least one drift region section that includes a semiconductor layer with first regions of a first doping type and second regions of a second doping type, wherein the first regions and the second regions are arranged alternatingly in a first lateral direction of the semiconductor layer, and wherein forming the at least one drift region section includes: forming an implantation mask on top of a first surface of the semiconductor layer, wherein the implantation mask includes first openings each having a first width in the first lateral direction; in a first implantation process, implanting dopant atoms of the first doping type through the first openings into the first surface; increasing a size of the first openings to obtain second openings having a second width in the lateral direction; in a second implantation process, implanting dopant atoms of the second doping type through the second openings into the first surface; removing the implantation mask; and after removing the implantation mask, in a third implantation process, implanting dopant atoms of the first doping type into the first surface.

Example 2—The method of example 1, wherein the implantation mask includes first mask regions between neighboring first openings, and wherein increasing the size of the first openings includes: forming a protection layer on top of the first mesa regions; and etching each of the first mesa regions beginning at opposite lateral ends, wherein each lateral end faces a respective one of the neighboring openings.

Example 3—The method of example 1 or 2, wherein the first implantation process includes implanting the dopant atoms of the first doping type at a first implantation dose, wherein the second implantation process includes implanting the dopant atoms of the second doping type at a second implantation dose, and wherein the third implantation process includes implanting the dopant atoms of the first doping type at a third implantation dose different from the second dopant dose.

Example 4—The method of example 3, wherein the second implantation dose at least approximately equals the first dopant dose.

Example 5—The method of example 4, wherein the third implantation dose is selected from between 40% and 60% of the first implantation dose.

Example 6—The method of example 4, wherein the first width, the second width, a width of mask regions that remain after forming the second openings, and the second and third implantation dose are adapted to one another such that $$0.8 \leq \frac{(w202 + w203) \cdot D3}{(w204 - w202) \cdot |D3 - D2|} \leq 1.2,$$

wherein w202 denotes the first width; w204 denotes the second width; w203 denotes a width of the mask regions that remain after forming the second openings; D2 denotes the second implantation dose; and D3 denotes the third implantation dose.

Example 7—A method including: forming at least one drift region section that includes a semiconductor layer with first regions of a first doping type and second regions of a second doping type, wherein the first regions and the second regions are arranged alternatingly in a first lateral direction of the semiconductor layer, and wherein forming the at least one drift region section includes: forming an implantation mask on top of a first surface of the semiconductor layer, wherein the implantation mask includes first openings each having a first width in the first lateral direction; in a first implantation process, implanting dopant atoms of the second doping type through the first openings into the first surface; reducing a size of the first openings to obtain second openings having a second width in the lateral direction; in a second implantation process, implanting dopant atoms of the first doping type through the second openings into the first surface;

removing the implantation mask; and after removing the implantation mask, in a third implantation process, implanting dopant atoms of the first doping type into the first surface.

Example 8—The method of example 7, wherein the implantation mask includes first mask regions between neighboring first openings, and wherein reducing the size of the first openings includes forming spacers adjoining the first mesa regions.

Example 9—The method of example 7 or 8, wherein the first implantation process includes implanting the dopant atoms of the first doping type at a first implantation dose, wherein the second implantation process includes implanting the dopant atoms of the second doping type at a second implantation dopant dose, and wherein the third implantation process includes implanting the dopant atoms of the first doping type at a third implantation dose different from the second implantation dose.

Example 10—The method of example 9, wherein the second implantation dose at least approximately equals the first implantation dose.

Example 11—The method of example 10, wherein the wherein the third implantation dose is selected from between 40% and 60% of the first implantation dose.

Example 12—The method according to example 10, wherein a width of mask regions between the first openings, the second width, a width of the spacers, and the first and third implantation doses are adapted to one another such that $$0.8 \leq \frac{(w504 + w501) \cdot D23}{2 \cdot w503 \cdot |D23 - D21|} \leq 1.2$$

wherein w501 denotes the width of the mask regions between the first openings, w504 denotes the second width, w503 denotes the width of the spacers, D21 denotes the first implantation dose, and D23 denotes the third implantation dose.

Example 13—The method of any one of the preceding examples, wherein forming the at least one drift region section includes forming a plurality of drift region sections one above the other.

Example 14—The method of example 11, wherein the plurality of drift region sections includes between 5 and 15 drift region sections.

Example 15—The method of any one of examples 1 to 14, wherein the at least one drift region section includes an uppermost drift region section, and wherein the method further includes forming a plurality of transistor cells in the uppermost drift region section.

Example 16—The method of any one of examples 1 to 14, wherein the at least one drift region section includes an uppermost drift region section, and wherein the method further includes: forming a further semiconductor layer on top of the uppermost drift region section; and forming a plurality of transistor cells in the further semiconductor layer.

Example 17—The method of any one of the preceding examples, wherein the semiconductor layer includes silicon carbide.

Example 18—The method of example 15, wherein the first type dopant atoms include nitrogen atoms and/or phosphorous atoms, and wherein the second type dopant atoms include aluminum atoms and/or boron atoms.

Example 19—The method of any one of the preceding examples, wherein the semiconductor layer has a thickness that is selected from between 1 micrometer and 6 micrometers.

Example 20—A superjunction device, including: at least one drift region section that includes a semiconductor layer with first regions of a first doping type and second regions of a second doping type, wherein the first regions and the second regions are arranged alternatingly in a first lateral direction of the semiconductor layer, wherein first regions of a first group include an implantation dose of the first doping type, only, and wherein a second group of the first regions include an implantation dose of the first doping type and an implantation dose of the second doping type.

What is claimed is:

1. A method, comprising:

forming at least one drift region section that includes a semiconductor layer with first regions of a first doping type and second regions of a second doping type, wherein the first regions and the second regions are arranged alternatingly in a first lateral direction of the semiconductor layer, wherein forming the at least one drift region section comprises:

forming an implantation mask on top of a first surface of the semiconductor layer, wherein the implantation mask comprises first openings each having a first width in the first lateral direction;

in a first implantation process, implanting dopant atoms of the first doping type through the first openings into a first part of the first surface;

increasing a size of the first openings to obtain second openings having a second width in the lateral direction;

in a second implantation process, implanting dopant atoms of the second doping type through the second openings into the first part of the first surface and a second part of the first surface;

removing the implantation mask; and after removing the implantation mask, in a third implantation process, implanting dopant atoms of the first doping type into the first surface, wherein the third implantation process is a blanket implantation that includes implanting dopant atoms of the first doping type into the first part of the first surface, the second part of the first surface, and a third part of the first surface.

2. The method of claim 1, wherein the implantation mask comprises first mask regions between neighboring first openings, and wherein increasing the size of the first openings comprises:

forming a protection layer on top of the first mesa regions; and etching each of the first mesa regions beginning at opposite lateral ends, wherein each lateral end faces a respective one of the neighboring openings.

3. The method of claim 1, wherein the first implantation process comprises implanting the dopant atoms of the first doping type at a first implantation dose, wherein the second implantation process comprises implanting the dopant atoms of the second doping type at a second implantation dose, and wherein the third implantation process comprises implanting the dopant atoms of the first doping type at a third implantation dose different from the second dopant dose.

4. The method of claim 3, wherein the second implantation dose at least approximately equals the first dopant dose.

5. The method of claim 4, wherein the third implantation dose is selected from between 40% and 60% of the first implantation dose.

6. The method of claim 4, wherein the first width, the second width, a width of mask regions that remain after forming the second openings, and the second and third implantation dose are adapted to one another such that $$0.8 \leq \frac{(w202 + w203) \cdot D3}{(w204 - w202) \cdot |D3 - D2|} \leq 1.2,$$

where w202 denotes the first width, w204 denotes the second width, w203 denotes a width of the mask regions that remain after forming the second openings, D2 denotes the second implantation dose, and D3 denotes the third implantation dose.

7. The method of claim 1, wherein forming the at least one drift region section comprises forming a plurality of drift region sections one above the other.

8. The method of claim 1, wherein the at least one drift region section comprises an uppermost drift region section, and wherein the method further comprises forming a plurality of transistor cells in the uppermost drift region section.

9. The method of claim 8, wherein the at least one drift region section comprises an uppermost drift region section, and wherein the method further comprises:

forming a further semiconductor layer on top of the uppermost drift region section; and forming a plurality of transistor cells in the further semiconductor layer.

10. The method of claim 8, wherein the first type dopant atoms comprise nitrogen atoms and/or phosphorous atoms, and wherein the second type dopant atoms comprise aluminum atoms and/or boron atoms.

11. The method of claim 1, wherein the semiconductor layer comprises silicon carbide.

12. The method of claim 1, wherein the semiconductor layer has a thickness that is selected from between 1 micrometer and 6 micrometers.

13. A method, comprising:

forming at least one drift region section that includes a semiconductor layer with first regions of a first doping type and second regions of a second doping type, wherein the first regions and the second regions are arranged alternatingly in a first lateral direction of the semiconductor layer, wherein forming the at least one drift region section comprises:

forming an implantation mask on top of a first surface of the semiconductor layer, wherein the implantation mask comprises first openings each having a first width in the first lateral direction;

in a first implantation process, implanting dopant atoms of the first doping type through the first openings into the first surface to form first implanted regions in the semiconductor layer;

increasing a size of the first openings to obtain second openings having a second width in the lateral direction;

in a second implantation process, implanting dopant atoms of the second doping type through the second openings into the first surface to form second implanted regions and third implanted regions in the semiconductor layer, wherein the second implanted regions result from implanting dopant atoms of the second doping type into the first implanted regions, and wherein the third implanted regions result from implanting dopant atoms of the second doping type into regions of the semiconductor layer that are uncovered in the process of increasing the size of the first openings in the implantation mask;

removing the implantation mask; and after removing the implantation mask, in a third implantation process, implanting dopant atoms of the first doping type into the first surface to form fourth implanted regions, fifth implanted regions, and sixth implanted regions in the semiconductor layer, wherein the fourth implanted regions result from implanting dopant atoms of the first doping type into the second implanted regions, wherein the fifth implanted regions result from implanting dopant atoms of the first doping type into the third implanted regions, and wherein the sixth implanted regions result from implanting dopant atoms of the first doping type into regions of the semiconductor layer that are uncovered by removing the implantation mask.

14. A method, comprising:

forming at least one drift region section that includes a semiconductor layer with first regions of a first doping type and second regions of a second doping type, wherein the first regions and the second regions are arranged alternatingly in a first lateral direction of the semiconductor layer, wherein forming the at least one drift region section comprises:

forming an implantation mask on top of a first surface of the semiconductor layer, wherein the implantation mask comprises first openings each having a first width in the first lateral direction;

in a first implantation process, implanting dopant atoms of the first doping type through the first openings into the first surface;

increasing a size of the first openings to obtain second openings having a second width in the lateral direction;

in a second implantation process, implanting dopant atoms of the second doping type through the second openings into the first surface;

removing the implantation mask; and after removing the implantation mask, in a third implantation process, implanting dopant atoms of the first doping type into the first surface, wherein the first implantation process comprises implanting the dopant atoms of the first doping type at a first implantation dose, wherein the second implantation process comprises implanting the dopant atoms of the second doping type at a second implantation dose, wherein the third implantation process comprises implanting the dopant atoms of the first doping type at a third implantation dose different from the second dopant dose, wherein the second implantation dose at least approximately equals the first dopant dose, wherein the third implantation dose is selected from between 40% and 60% of the first implantation dose, and wherein the first width, the second width, a width of mask regions that remain after forming the second openings, and the second and third implantation dose are adapted to one another such that $$0.8 \leq \frac{(w202 + w203) \cdot D3}{(w204 - w202) \cdot |D3 - D2|} \leq 1.2,$$

where w202 denotes the first width, w204 denotes the second width, w203 denotes a width of the mask regions that remain after forming the second openings, D2 denotes the second implantation dose, and D3 denotes the third implantation dose.

* * * * *